(12) United States Patent
Du et al.

(10) Patent No.: US 12,356,810 B2
(45) Date of Patent: Jul. 8, 2025

(54) DISPLAY SUBSTRATE WITH STEPPED WIRE CONFIGURATION, DUMMY RECTANGLE UNITS AND DISPLAY APPARATUS, AND MANUFACTURING METHOD THEREOF

(71) Applicants: Chengdu BOE Optoelectronics Technology Co., Ltd., Sichuan (CN); BOE Technology Group Co., Ltd., Beijing (CN)

(72) Inventors: Lili Du, Beijing (CN); Ming Hu, Beijing (CN); Feng Wei, Beijing (CN); Hongjun Zhou, Beijing (CN); Yue Long, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 894 days.

(21) Appl. No.: 17/419,305

(22) PCT Filed: Oct. 23, 2020

(86) PCT No.: PCT/CN2020/123336
§ 371 (c)(1),
(2) Date: Jun. 29, 2021

(87) PCT Pub. No.: WO2022/082753
PCT Pub. Date: Apr. 28, 2022

(65) Prior Publication Data
US 2022/0320228 A1    Oct. 6, 2022

(51) Int. Cl.
*H10K 59/131*     (2023.01)
*G09G 3/3266*     (2016.01)
*H10K 59/12*      (2023.01)

(52) U.S. Cl.
CPC ......... *H10K 59/131* (2023.02); *G09G 3/3266* (2013.01); *G09G 2310/0286* (2013.01); *G09G 2310/0297* (2013.01); *H10K 59/1201* (2023.02)

(58) Field of Classification Search
CPC .............. H10K 59/131; G09G 3/3266; G09G 2310/0297
See application file for complete search history.

(56) References Cited

U.S. PATENT DOCUMENTS 7,557,791 B2   7/2009  Tokumura
2001/0007448 A1*  7/2001  Kobayashi ............... G09G 3/20
                                                    345/100
(Continued)

FOREIGN PATENT DOCUMENTS

CN        104285177 A        1/2015
CN        107039467 A        8/2017
(Continued)

OTHER PUBLICATIONS

Hongguang Xu, "Study on the crucial technologies of OLED-on-silicon microdisplay", Shanghai University Doctoral Dissertation, Sep. 2013.

*Primary Examiner* — Shaun M Campbell
*Assistant Examiner* — David Paul Sedorook
(74) *Attorney, Agent, or Firm* — Ling Wu; Stephen Yang; Ling Wu Ling and Yang Intellectual Property

(57) ABSTRACT

Provided are a display substrate, a manufacturing method thereof and a display apparatus. The display substrate includes a display region and a bezel region. The bezel region includes a first bezel and a second bezel oppositely disposed in a first direction, a third bezel and a fourth bezel oppositely disposed in a second direction, a first corner connecting a first bezel and a third bezel, a second corner connecting a second bezel and a third bezel, a third corner
(Continued)

connecting a first bezel and a fourth bezel, and a fourth corner connecting a second bezel and a fourth bezel; at least one of a first corner to a fourth corner is an arced corner; a first direction is an extending direction of scanning signal wires in the display region, and a second direction is an extending direction of data signal wires in the display region.

19 Claims, 16 Drawing Sheets

(56) References Cited

U.S. PATENT DOCUMENTS

| | | | | |
|---|---|---|---|---|
| 2003/0043331 | A1* | 3/2003 | Oowaki | G02F 1/13452 349/151 |
| 2005/0174015 | A1* | 8/2005 | Scott | G06V 40/1306 310/334 |
| 2014/0253419 | A1* | 9/2014 | Tanada | G09G 3/20 345/55 |
| 2015/0138466 | A1* | 5/2015 | Mori | G02F 1/136213 349/38 |
| 2015/0194090 | A1* | 7/2015 | Lin | G09G 3/2092 345/205 |
| 2018/0006105 | A1* | 1/2018 | Kim | G09G 3/3225 |
| 2018/0151100 | A1 | 5/2018 | Zhou | |
| 2018/0204895 | A1* | 7/2018 | Lin | H10K 59/131 |
| 2018/0330653 | A1 | 11/2018 | Zhou | |
| 2020/0050068 | A1* | 2/2020 | Park | G02F 1/136286 |
| 2021/0027703 | A1* | 1/2021 | Lin | G09G 3/20 |
| 2021/0349500 | A1* | 11/2021 | Qin | G06F 1/1656 |
| 2021/0366389 | A1* | 11/2021 | Liu | G09G 3/3233 |

FOREIGN PATENT DOCUMENTS

| | | |
|---|---|---|
| CN | 107154232 A | 9/2017 |
| CN | 108389516 A | 8/2018 |
| CN | 110827673 A | 2/2020 |
| CN | 111489648 A | 8/2020 |
| CN | 111653198 A | 9/2020 |
| KR | 10-2017-0126537 A | 11/2017 |

* cited by examiner

DISPLAY SUBSTRATE WITH STEPPED WIRE CONFIGURATION, DUMMY RECTANGLE UNITS AND DISPLAY APPARATUS, AND MANUFACTURING METHOD THEREOF

TECHNICAL FIELD

The present disclosure relates to, but is not limited to, the field of display technology, in particular to a display substrate and a manufacturing method thereof, and a display apparatus.

BACKGROUND

An organic light-emitting diode (abbreviated as OLED) is an active light-emitting display apparatus, and has advantages of self-luminescence, wide view angle, high contrast, low power consumption, extremely high response speed, etc. With continuous development of the display technology, a display apparatus with the OLED as a light-emitting device and thin film transistor (TFT) for signal control has become the mainstream product in the display field.

SUMMARY

The following is a summary of subject matter described in detail herein. This summary is not intended to limit the protection scope of the claims.

In one aspect, an exemplary embodiment of the present disclosure provides a display substrate including a display region and a bezel region located around the display region; the bezel region includes a first bezel and a second bezel oppositely disposed in a first direction, a third and a fourth bezel oppositely disposed in a second direction, a first corner connecting a first bezel and a third bezel, a second corner connecting a second bezel and a third bezel, a third corner connecting a first and a fourth bezel, and a fourth corner connecting a second bezel and a fourth bezel; at least one of the first to the fourth corner is an arced corner; the first direction is an extending direction of scanning signal wires in the display region, and the second direction is an extending direction of data signal wires in the display region; at least one of the first to the fourth corner is provided with a first wiring and a second wiring, a plurality of first rectangles are formed between the first wiring and the second wiring, and a plurality of shift register units are respectively disposed in the first rectangles.

In an exemplary embodiment, at least one of the first to the fourth corner is further provided with a third wiring, which is disposed between the display region and the second wiring, and a plurality of second rectangles are formed between the second wiring and the third wiring.

In an exemplary embodiment, the second rectangles have long sides and short sides, and an extending direction of the long sides of the second rectangle is parallel to the first direction.

In an exemplary embodiment, at least one of the first corner and the second corner is provided with multiple first test units, and the first test units are respectively disposed in the plurality of second rectangles.

In an exemplary embodiment, at least one first test unit is disposed in a same second rectangle in at least one of the first corner and the second corner.

In an exemplary embodiment, at least two shift register units are disposed in a same first rectangle in at least one of the first corner and the second corner.

In an exemplary embodiment, the first wiring includes a gate signal wire stepped wired, the second wiring includes a test signal wire stepped wired, and the third wiring includes a power signal wire stepped wired; a minimum distance between the power signal wire and the edge of the display region is smaller than that between the test signal wire and the edge of the display region, and a minimum distance between the test signal wire and the edge of the display region is smaller than that between the gate signal wire and the edge of the display region.

In an exemplary embodiment, the test signal wire includes at least one test control signal wire and multiple test data signal wires; the first test unit includes multiple test transistors, which are disposed along the first direction; control electrodes of the multiple test transistors are connected to a same test control signal wire, first electrodes of the multiple test transistors are respectively connected to different test data signal wires, and second electrodes of the test transistors are respectively connected to different data signal wires in the display region.

In an exemplary embodiment, the arrangement of the plurality of test transistors along the first direction includes that the test transistors are sequentially disposed along the first direction and are flush in the second direction.

In an exemplary embodiment, at least one third rectangle is formed between the test control signal wire and the test data signal wire, and a dummy unit is disposed in the at least one third rectangle.

In an exemplary embodiment, at least one compensation capacitor is provided between the power signal wire and the display region, and the compensation capacitor includes a first polar plate and a second polar plate, wherein the first polar plate is connected to a second power line, one terminal of the second polar plate is connected to a test data signal wire of a first test unit, and the other terminal of the second polar plate is connected to a data signal wire of the display region.

In an exemplary embodiment, the first test unit has a height of 0.9 times to 1.3 times its width; wherein a height of the first test unit is the dimension of the first test unit in a first direction, and a width of the first test unit is the dimension of the first test unit in a second direction.

In an exemplary embodiment, the first test unit has a height of 70 μm to 100 μm and a width of 60 μm to 90 μm.

In an exemplary embodiment, at least one of the third corner and the fourth corner is provided with a plurality of multiplexing units, which are respectively disposed in the multiple second rectangles.

In an exemplary embodiment, at least one multiplexing unit is disposed in a same second rectangle in at least one of the third corner and the fourth corner.

In an exemplary embodiment, at least one shift register unit is disposed in a same first rectangle in at least one of the third corner and the fourth corner.

In an exemplary embodiment, the first wiring includes a gate signal wire stepped wired, the second wiring includes a multiplexing signal wire stepped wired, and the third wiring includes a power signal wire stepped wired; a minimum distance between the power signal wire and the edge of the display region is smaller than that between the multiplexing signal wire and the edge of the display region, and a minimum distance between the multiplexing signal wire and the edge of the display region is smaller than that between the gate signal wire and the edge of the display region.

In an exemplary embodiment, the multiplexing signal wire includes a plurality of multiplexing control signal wires and at least one multiplexing data signal wire; the multiplexing unit includes a plurality of multiplexing transistors which are disposed along a first direction; control electrodes of the plurality of multiplexing transistors are connected to different multiplexing control signal wires, first electrodes of the plurality of multiplexing transistors are connected to a same multiplexing data signal wire, and second electrodes of the plurality of multiplexing transistors are respectively connected to different data signal wires in a display region.

In an exemplary embodiment, the arrangement of the multiplexing transistors along the first direction includes that the multiplexing transistors are sequentially disposed along the first direction and are flush in the second direction.

In an exemplary embodiment, the multiplexing unit has a height of 0.5 times to 0.9 times of its width; wherein the height of the multiplexing unit is the dimension of the multiplexing unit in the first direction, and the width of the multiplexing unit is the dimension of the multiplexing unit in the second direction.

In an exemplary embodiment, the multiplexing unit has a height of 35 µm to 45 µm and a width of 48 µm to 70 µm.

In another aspect, an exemplary embodiment further provides a display apparatus, including any one of the aforementioned display substrate.

In another aspect, an exemplary embodiment of the present disclosure further provides a method for manufacturing a display substrate. The display substrate includes a display region and a bezel region on the periphery of the display region; the bezel region includes a first bezel and a second bezel oppositely disposed in the first direction, a third and a fourth bezel oppositely disposed in the second direction, a first corner connecting a first bezel and a third bezel, a second corner connecting a second bezel and a third bezel, a third corner connecting a first and a fourth bezel, and a fourth corner connecting a second bezel and a fourth bezel; at least one of the first to the fourth corner is an arced corner; the first direction is an extending direction of scanning signal wires in the display region, and the second direction is an extending direction of data signal wires in the display region; and the manufacturing method includes: forming a display structure in the display region, and forming a first wiring, a second wiring and multiple shift register units in at least one of the first to the fourth corner; wherein, a plurality of first rectangles are formed between the first wiring and the second wiring, and a plurality of shift register units are respectively disposed in the first rectangles.

In an exemplary embodiment, at least one of the first to the fourth corner is further provided with a third wiring, which is disposed between the display region and the second wiring, and multiple second rectangles are formed between the third wiring and the second wiring.

Other aspects will become apparent after the drawings and the detailed description are read and understood.

BRIEF DESCRIPTION OF DRAWINGS

Drawings are used to provide a further understanding of technical solutions of the present disclosure and form a part of the description to explain the technical solutions of the present disclosure together with embodiments of the present disclosure, which do not constitute any limitation on the technical solutions of the present disclosure. Shapes and sizes of the components in the drawings do not reflect true proportions and only to be used to schematically illustrate contents of the present disclosure.

DETAILED DESCRIPTION

Figure 1:
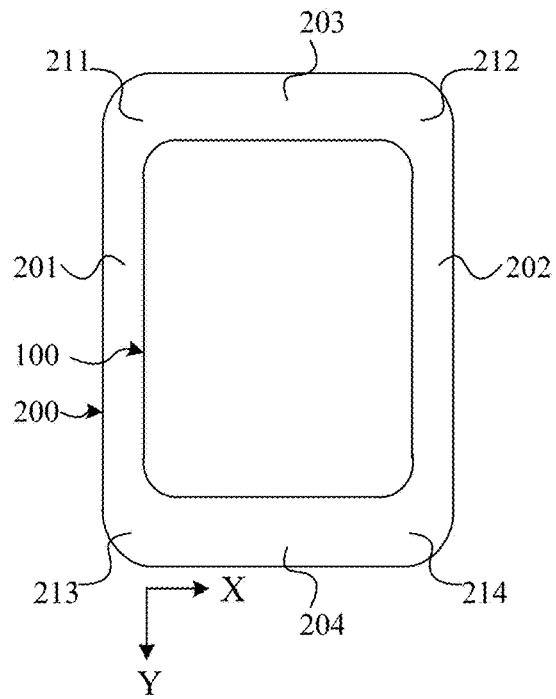
FIG. 1 is a schematic diagram of the appearance of a display apparatus.

Hereinafter embodiments of the present disclosure will be described in detail with reference to the accompanying drawings. It should be noted that the embodiments may be implemented in a number of different forms. Those of ordinary skills in the art will readily understand the fact that implementations and contents may be transformed into a variety of forms without departing from the spirit and scope of the present disclosure. Therefore, the present disclosure should not be construed as being limited only to what is described in the following embodiments. The embodiments and features in the embodiments in the present disclosure may be combined randomly if there is no conflict.

In the accompanying drawings, sizes of constituent elements and thicknesses and areas of layers are sometimes exaggerated for clarity. Therefore, an implementation of the present disclosure is not necessarily limited to the sizes shown. The shapes and sizes of components in the accompanying drawings do not reflect true proportions. In addition, the drawings schematically show ideal examples, and an implementation of the present disclosure is not limited to the shapes or numerical values shown in the drawings.

The ordinal numbers "first", "second", "third" and the like in this specification are used to avoid confusion between constituent elements, but not to constitute limitations on quantities.

In this specification, for sake of convenience, wordings such as "central", "upper", "lower", "front", "rear", "vertical", "horizontal", "top", "bottom", "inner", "outer" and the like describe the orientation or positional relations between constituent elements with reference to the drawings, which are only for ease of description of this specification and for simplification of the description, rather than indicating or implying that the apparatus or element referred to must have a specific orientation, or must be constructed and operated in a particular orientation, and therefore cannot be construed as limitations on the present disclosure. The positional relations of the constituent elements may be appropriately changed according to the direction in which each constituent element is described. Therefore, they are not limited to the wordings in the specification, and may be replaced appropriately according to the situations.

In this specification, terms "install", "connect" and "couple" shall be understood in a broad sense unless otherwise explicitly specified and defined. For example, it may be fixedly connected, or removable connected, or integrally connected; it may be mechanically connected, or electrically connected; it may be directly connected, or indirectly connected through middleware, or internal connection between two elements. For those of ordinary skills in the art, the specific meanings of the above terms in the present disclosure may be understood according to specific situations.

In this specification, a transistor refers to an element including at least three terminals, namely a gate electrode, a drain electrode and a source electrode. The transistor has a channel region between the drain electrode (a drain electrode terminal, a drain region or a drain electrode) and the source electrode (a source electrode terminal, a source region or a source electrode), and a current may flow through the drain electrode, the channel region and the source electrode. It should be noted that in this specification, the channel region refers to a region through which current mainly flows.

In this specification, a first electrode may be a drain electrode and a second electrode may be a source electrode, or the first electrode may be a source electrode and the second electrode may be a drain electrode. The functions of the "source electrode" and that of the "drain electrode" are interchangeable under circumstances where transistors with opposite polarities are used or where the current direction changes during circuit operation. Therefore, in this specification, "source electrode" and "drain electrode" are interchangeable.

In the present specification, "connection" includes the case where the components are connected together through an element with certain electrical effects. The "element having a certain electrical action" is not particularly limited as long as it can transmit and receive electrical signals between connected constituent elements. Examples of the "elements having a certain electrical function" include not only electrodes and wirings, but also switching elements such as transistors, resistors, inductors, capacitors, and other elements having various functions.

In this specification, "parallel" refers to a state in which two straight lines form an angle above −10 degrees and below 10 degrees, and thus also includes a state in which the angle is above −5 degrees and below 5 degrees. In addition, "vertical" refers to a state in which two straight lines form an angle between 80 degrees and 100 degrees and thus, includes a state in which the angle is between 85 and 95 degrees.

In the present disclosure, "about" means that there is no strict limit for a value, and values within an error range during processes and measurement are allowed.

With the development of OLED display technology, "screen-to-body ratio" has become an important performance parameter of display apparatuses. According to consumers' pursuit of portable display products and viewing angle effect, extremely narrow bezel or even full screen display has become a new trend in the development of OLED display products. Therefore, the narrowing of bezel has attracted increasing attention in the design of OLED display products.

FIG. 1 is a schematic diagram of the appearance of a display apparatus, which has a rectangular shape with rounded chamfers. As shown in FIG. 1, the display substrate includes a display region 100 and a bezel region 200 on the periphery of the display region 100. In an exemplary embodiment, a display region 100 may include a first edge (left edge) and a second edge (right edge) which are oppositely disposed in a first direction X, and a third edge (upper edge) and a fourth edge (lower edge) which are oppositely disposed in a second direction Y, and adjacent edges are connected by arced chamfers, forming a quadrilateral shape with rounded chamfers. In an exemplary embodiment, a bezel region 200 may include a first bezel (left bezel) 201 and a second bezel (right bezel) 202 oppositely disposed in a first direction X, a third bezel (upper bezel) 203 and a fourth bezel (lower bezel) 204 oppositely disposed in a second direction Y, a first corner 211 connecting a first bezel 201 and a third bezel 203, a second corner 212 connecting a second bezel 202 and a third bezel 203, a third corner 213 connecting a first bezel 201 and a fourth bezel 204, and a fourth corner 214 connecting a second bezel 202 and a fourth bezel 204.

In an exemplary embodiment, a first edge and a second edge may be parallel to a second direction Y, a third edge and a fourth edge may be parallel to a first direction X, and a first direction X intersects with a second direction Y. In an exemplary embodiment, a first direction X may be an extending direction (row direction) of a scanning signal wire in a display region, and a second direction Y may be an extending direction (column direction) of a data signal wire in s display region, and a first direction X and a second direction Y may be perpendicular to each other.

In an exemplary embodiment, in order to reduce the cost and simplify the driving and detecting structure, part of the display driving and performance detecting circuits are often disposed in the bezel region. With the improvement of resolution and the increase of the quantity of pixels, the quantity of display driving circuits and performance detection circuits also increases, which not only increases the layout difficulty of circuits, but also cause the circuit to occupy a large space, which is not conducive to a design of narrow bezel. In addition, researches show that for a display substrate of a rectangular shape with rounded chamfers, a complex circuit layout in the arced corner region is one of the bottlenecks to reduce the bezel.

Figure 2:
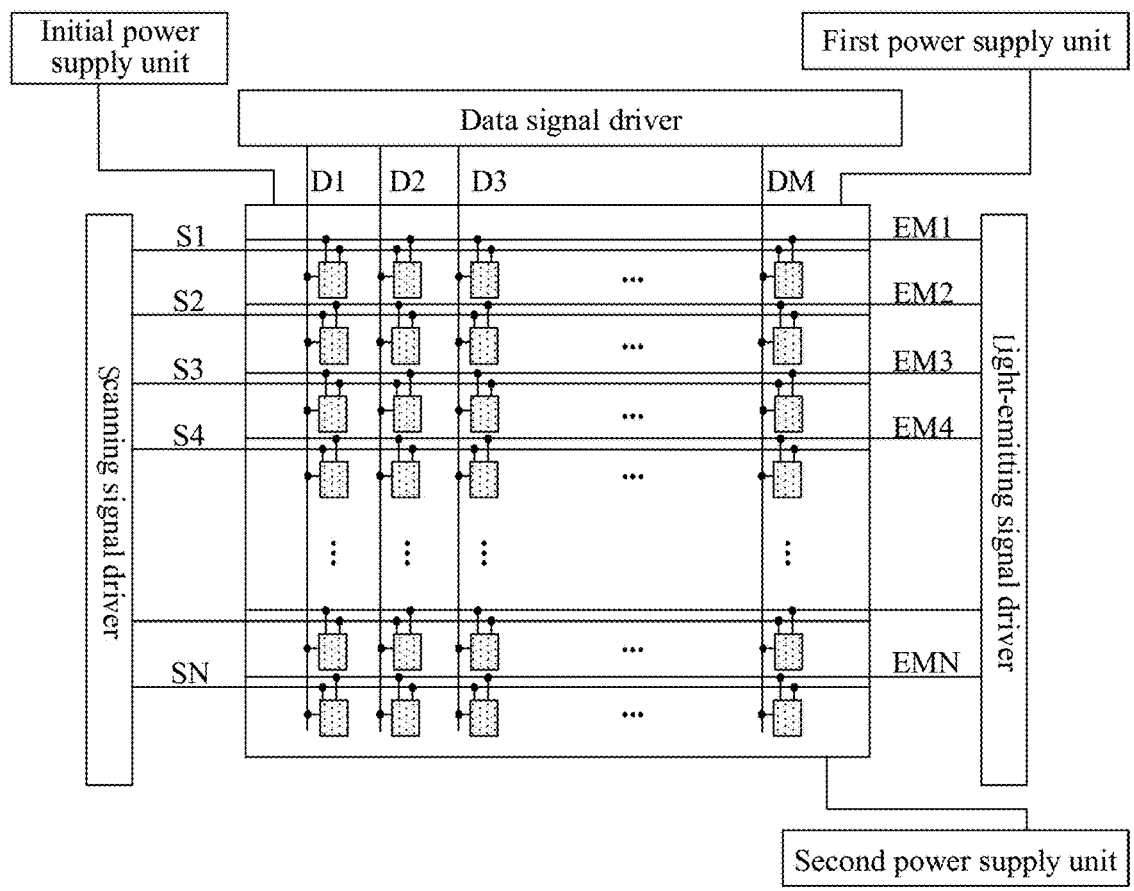
FIG. 2 is a schematic diagram of a structure of a display apparatus.

FIG. 2 is a schematic diagram of a structure of a display apparatus. As shown in FIG. 2, the OLED display apparatus may include a scanning signal driver, a data signal driver, a light-emitting signal driver, an OLED display substrate, a first power supply unit, a second power supply unit and an initial power supply unit. In an exemplary embodiment, an OLED display substrate at least includes multiple scanning signal wires (S1 to SN), multiple data signal wires (D1 to DM) and multiple light-emitting signal wires (EM1 to EMN); the scanning signal driver is configured to sequentially supply scanning signals to the multiple scanning signal wires (S1 to SN), the data signal driver is configured to supply data signals to the multiple data signal wires (D1 to DM), and the light-emitting signal driver is configured to sequentially supply light-emitting control signals to the multiple light-emitting signal wires (EM1 to EMN). In an exemplary embodiment, multiple scanning signal wires and multiple light-emitting signal wires extend along a horizontal direction, and multiple data signal wires extend along a vertical direction. In an exemplary embodiment, an OLED display substrate includes multiple scanning signal wires, light-emitting signal wires and data signal wires crossing to define multiple sub-pixels, and at least one sub-pixel includes a pixel driving circuit and a light-emitting device. A first power supply unit, a second power supply unit and an initial power supply unit are configured to supply a first power supply voltage, a second power supply voltage and an initial power supply voltage to a pixel driving circuit through a first power supply line, a second power supply line and an initial signal wire, respectively.

Figure 3:
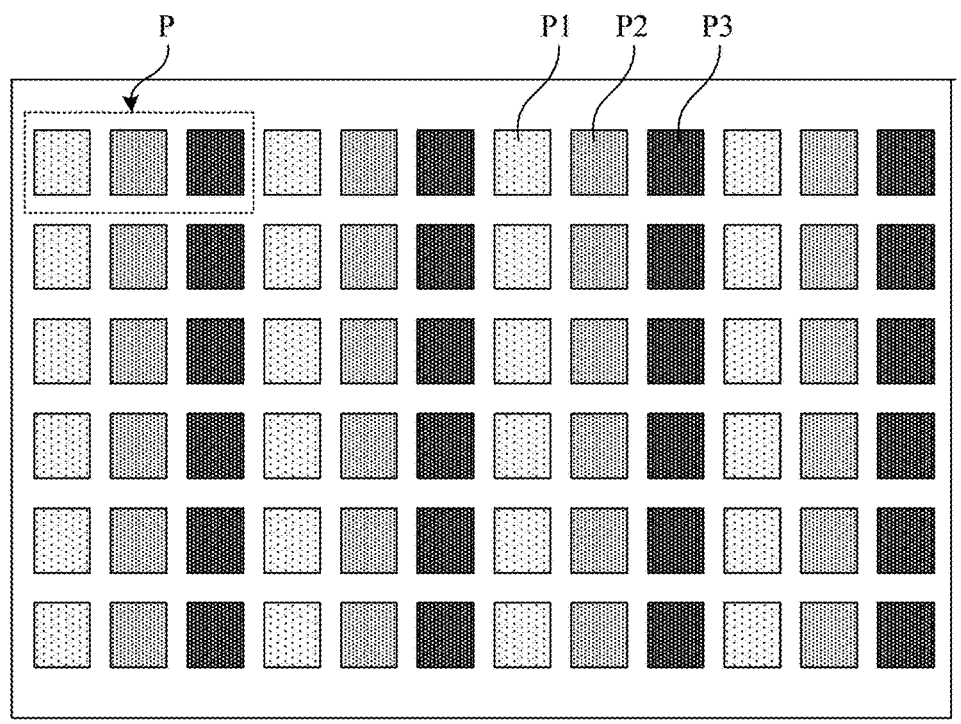
FIG. 3 is a schematic plan view of a display region of a display substrate.

FIG. 3 is a schematic plan view of a display region of a display substrate. As shown in FIG. 3, a display region may include multiple pixel units P disposed in a matrix, at least one of which includes a first sub-pixel P1 emitting light of a first color, a second sub-pixel P2 emitting light of a second color, and a third sub-pixel P3 emitting light of a third color; the first sub-pixel P1, the second sub-pixel P2, and the third sub-pixel P3 each include a pixel driving circuit and a light-emitting device. The pixel driving circuits in the first sub-pixel P1, the second sub-pixel P2, and the third sub-pixel P3 are respectively connected to the scanning signal wire, the data signal wire and the light-emitting signal wire; the pixel driving circuit is configured to receive a data voltage transmitted by the data signal wire and output a corresponding current to the light-emitting device under a control of the scanning signal wire and the light-emitting signal wire. The light-emitting devices in the first sub-pixel P1, the second sub-pixel P2 and the third sub-pixel P3 are respectively connected to the pixel driving circuits of the sub-pixels where the light-emitting devices are located, and the light-emitting device is configured to emit light with a corresponding brightness in response to a current output by the pixel driving circuit of the sub-pixel where the light-emitting device is located.

In an exemplary embodiment, the pixel unit P may include red, green and blue sub-pixels, or may include red, green, blue and white sub-pixels, which is not limited in the present disclosure. In an exemplary embodiment, the sub-pixel in the pixel unit may have a shape of rectangle, diamond, pentagon or hexagon. When the pixel unit includes three sub-pixels, the three sub-pixels may be disposed in a manner to stand side by side horizontally, in a manner to stand side by side vertically, or in a pyramid manner with two units sitting at the bottom and one unit placed on top; when the pixel unit includes four sub-pixels, the four sub-pixels may be disposed in a manner to stand side by side horizontally, in a manner to stand side by side vertically, or in a manner to form a square, which is not specifically limited in the present disclosure.

Figure 4:
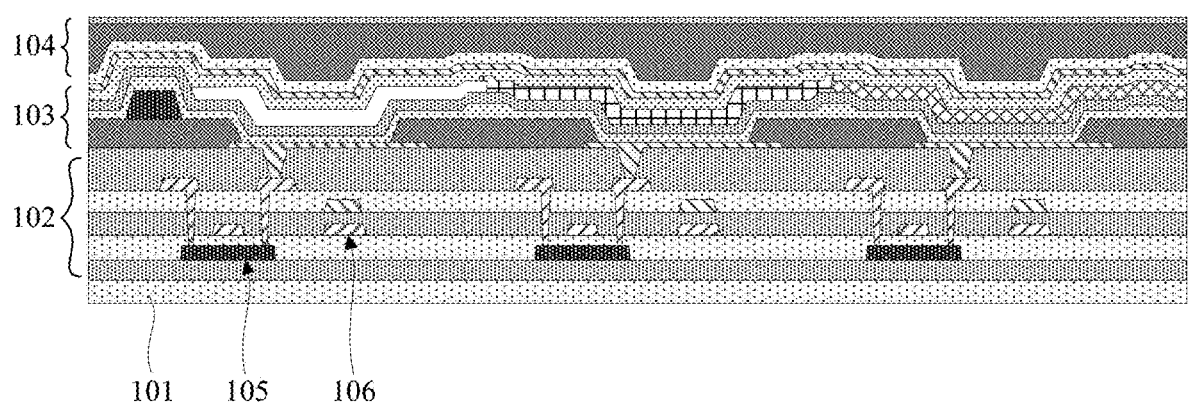
FIG. 4 is a schematic diagram of a cross-sectional view of a structure of a display region of a display substrate.

FIG. 4 is a schematic diagram of a cross-sectional view of a structure of a display region of a display substrate, showing a structure of three sub-pixels in an OLED display substrate. As shown in FIG. 4, on a direction perpendicular to the display substrate, the display substrate may include a driving circuit layer 102 disposed on a substrate 101, a light-emitting device 103 disposed on a side of the driving circuit layer 102 away from the substrate 101, and an encapsulation layer 104 disposed on a side of the light-emitting device 103 away from the substrate 101. In some possible implementations, the display substrate may include other film layers, such as post spacers, etc., which is not limited in the present disclosure.

In an exemplary implementation, the substrate may be a flexible substrate or may be a rigid substrate. The flexible substrate may include a first flexible material layer, a first inorganic material layer, a semiconductor layer, a second flexible material layer and a second inorganic material layer which are stacked, wherein materials of the first flexible material layer and the second flexible material layer may be polyimide (PI), polyethylene terephthalate (PET) or a polymer soft film with surface treatment; materials of the first inorganic material layer and the second inorganic material layer may be silicon nitride (SiNx) or silicon oxide (SiOx), etc., for improving the water-resistance and oxygen-resistance of the substrate; and the material of the semiconductor layer may be amorphous silicon (a-si).

In an exemplary embodiment, a driving circuit layer 102 of each sub-pixel may include multiple transistors and multiple storage capacitors forming a pixel driving circuit, an example of which is illustrated in FIG. 4 where each sub-pixel includes a transistor and a storage capacitor. In some possible implementations, a driving circuit layer 102 of each sub-pixel may include: a first insulating layer 201 disposed on a substrate; an active layer disposed on the first insulating layer; a second insulating layer 202 covering the active layer; a gate electrode and a first capacitor electrode disposed on the second insulating layer 202; a third insulating layer 203 covering the gate electrode and the first capacitor electrode; a second capacitor electrode disposed on the third insulating layer 203; a fourth insulating layer 204 covering the second capacitor electrode, wherein the second insulating layer 202, the third insulating layer 203 and the fourth insulating layer 204 are provided with vias exposing the active layer; a source electrode and a drain electrode disposed on the fourth insulating layer 204, wherein the source electrode and the drain electrode are respectively connected to the active layer through vias; and a planarization layer 205 covering the aforementioned structure, wherein the planarization layer 205 is provided with a via exposing the drain electrode. The active layer, the gate electrode, the source electrode and the drain electrode form a driving transistor 105. The first capacitor electrode and the second capacitor electrode form a storage capacitor 106.

In an exemplary embodiment, a light-emitting device 103 may include an anode, a pixel define layer, an organic light-emitting layer and a cathode. The anode is disposed on the planarization layer, and is connected to the drain electrode of a driving transistor through a via formed in the planarization layer; the pixel define layer is disposed on the anode and the planarization layer, and the pixel define layer is provided with a pixel opening exposing the anode; the organic light-emitting layer is at least partially disposed in the pixel opening, and is connected to the anode; cathode is provided on the organic light-emitting layer, and is connected to the organic light-emitting layer; and the organic light-emitting layer emits light of corresponding colors under anode and cathode actuation.

In an exemplary implementation, an encapsulation layer 104 may include a first encapsulation layer, a second encapsulation layer and a third encapsulation layer that are stacked together; the first encapsulation layer and the third encapsulation layer may be made of an inorganic material, and the second encapsulation layer may be made of an organic material; the second encapsulation layer is disposed between the first encapsulation layer and the third encapsulation layer to ensure that external moisture cannot enter into the light-emitting device 103.

In an exemplary embodiment, an organic light-emitting layer may at least include a hole injection layer, a hole transport layer, a light-emitting layer and a hole blocking layer which are stacked on an anode. In an exemplary embodiment, the hole injection layers of all sub-pixels is a common layer connected together; the hole transport layers of all sub-pixels is a common layer connected together; the light-emitting layers of adjacent sub-pixels may be slightly overlapped or isolated; and the hole blocking layers is a common layer connected together.

Figure 5:
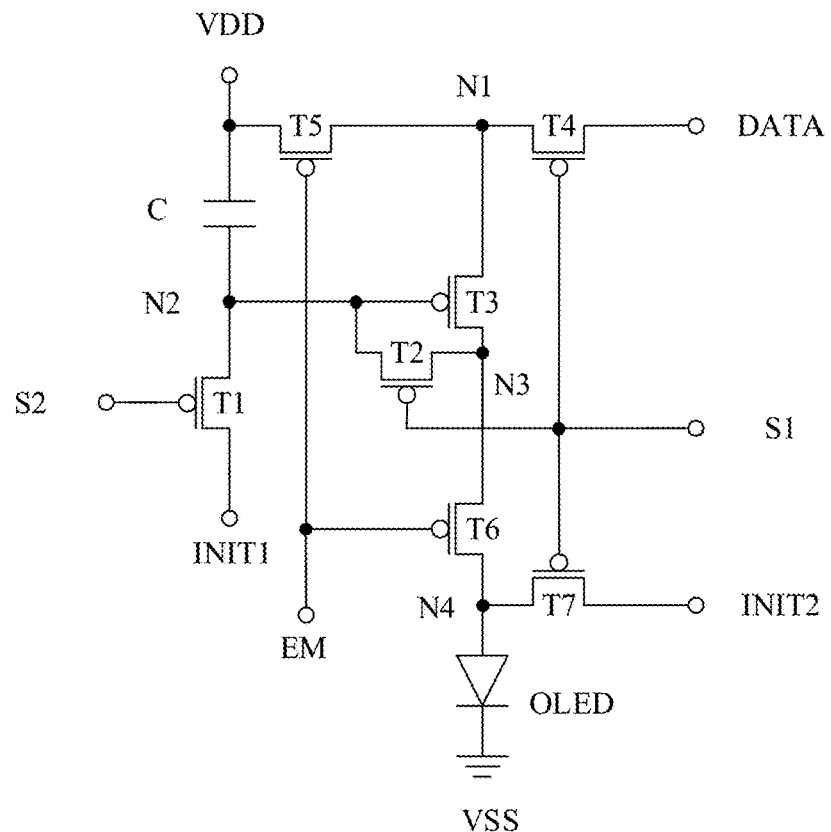
FIG. 5 is a diagram of an equivalent circuit of a pixel driving circuit.

In an exemplary implementation, the pixel driving circuit may have a structure of 3T1C, 4T1C, 5T1C, 5T2C, 6T1C or 7T1C. FIG. 5 is a diagram of an equivalent circuit of a pixel driving circuit. As shown in FIG. 5, a pixel driving circuit may include 7 switching transistors (a first transistor T1 to a seventh transistor T7), 1 storage capacitor C and 8 signal wires (a data signal wire DATA, a first scanning signal wire S1, a second scanning signal wire S2, a first initial signal wire INIT1, a second initial signal wire INIT2, a first power supply line VSS, a second power supply line VDD and a light-emitting signal wire EM).

In an exemplary implementation, a control electrode of a first transistor T1 is connected to a second scanning signal wire S2, a first electrode of the first transistor T1 is connected to a first initial signal wire INIT1, and a second electrode of the first transistor is connected to a second node N2. A control electrode of a second transistor T2 is connected to a first scanning signal wire S1, a first electrode of the second transistor T2 is connected to the second node N2, and a second electrode of the second transistor T2 is connected to a third node N3. A control electrode of a third transistor T3 is connected to the second node N2, a first electrode of the third transistor T3 is connected to a first node N1, and a second electrode of the third transistor T3 is connected to the third node N3. A control electrode of a fourth transistor T4 is connected to the first scanning signal wire S1, a first electrode of the fourth transistor T4 is connected to a data signal wire DATA, and a second electrode of the fourth transistor T4 is connected to the first node N1. A control electrode of a fifth transistor T5 is connected to a light-emitting signal wire EM, a first electrode of the fifth transistor T5 is connected to a second power supply line VDD, and a second electrode of the fifth transistor T5 is connected to the first node N1. A control electrode of the sixth transistor T6 is connected to the light-emitting signal wire EM, a first electrode of the sixth transistor T6 is connected to the third node N3, and a second electrode of the sixth transistor T6 is connected to a first electrode of the light-emitting device. A control electrode of the seventh transistor T7 is connected to the first scanning signal wire S1, a first electrode of the seventh transistor T7 is connected to the second initial signal wire INIT2, and a second electrode of the seventh transistor T7 is connected to the first electrode of the light-emitting device. A first terminal of the storage capacitor C is connected to the second power supply line VDD, and a second terminal of the storage capacitor C is connected to the second node N2.

In an exemplary implementation, the first transistor T1 to the seventh transistor T7 may be P-type transistors or may be N-type transistors. Adopting transistors of the same type in the pixel driving circuit may simplify a process flow, reduce difficulty in a manufacturing process of the display panel, and improve a product yield. In some possible implementations, the first transistor T1 to the seventh transistor T7 may include P-type transistors and N-type transistors.

In an exemplary implementation, a second electrode of a light-emitting device is connected to a first power supply line VSS; a signal on the first power supply line VSS is a low level signal, and a signal on the second power supply line VDD is a high level signal that is continuously supplied. A first scanning signal wire S1 is a scanning signal wire for a pixel driving circuit of a current display row, and a second scanning signal wire S2 is a scanning signal wire for a pixel driving circuit of a previous display row; that is, for an n-th display row, a first scanning signal wire S1 is S(n), a second scanning signal wire S2 is S($n-1$), a second scanning signal wire S2 of the current display row and the first scanning signal wire S1 for the pixel driving circuit of the previous display row are the same signal wire, which may reduce the signal wires of the display panel and achieve the narrow bezel of the display panel.

In an exemplary embodiment, a bezel region of a display substrate may be provided with a gate driving circuit (GOA), a test circuit (CT), and a multiplexing circuit (MUX). In an exemplary embodiment, a gate driving circuit may include multiple cascaded shift register units, each of which is connected to at least one scanning signal wire of a display region and configured to provide a gate driving signal to at least one scanning signal wire of the display region. A test circuit may include multiple test units, each of which is connected to multiple data signal wires of the display region and configured to provide test data signals to the multiple data signal wires of the display region. A multiplexing circuit may include a plurality of multiplexing units, each of which is connected to multiple data signal wires of the display region and configured so that a signal source can provide data signals to multiple data signal wires. In some possible implementations, the specific forms of shift register units are various, which is not limited in the present disclosure.

Figure 6:
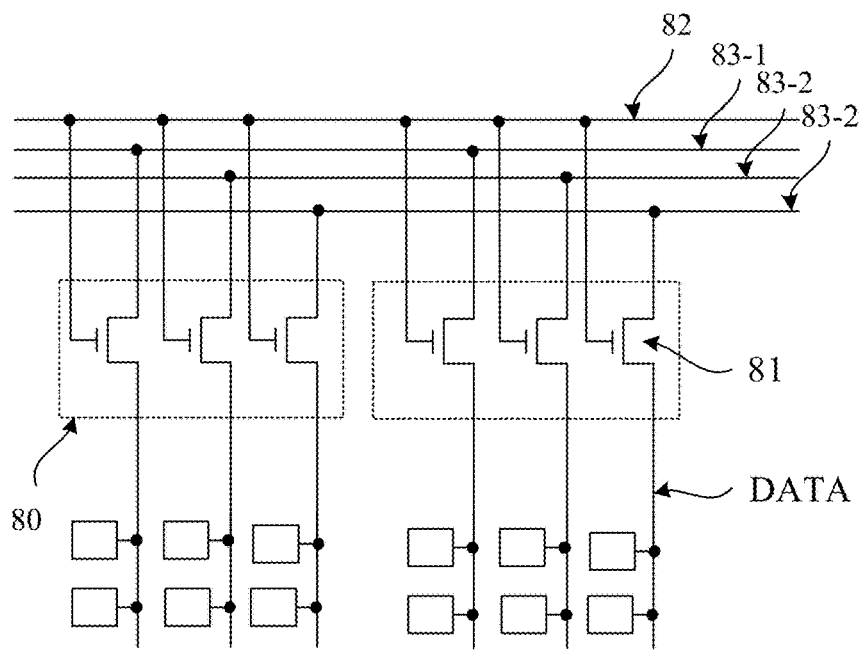
FIG. 6 is a diagram of an equivalent circuit of a test circuit.

In an exemplary embodiment, a test circuit may include at least one test control signal wire, a plurality of test data signal wires, and a plurality of test units, each of the test units is connected to the test control signal wire and multiple data signal wires, and is connected with a plurality of data signal wires in the display region. The test units are configured to, according to the control of the test control signal wires, supply (simultaneously or separately) signals of the test data signal wires to a plurality of data signal wires of the display region connected to them to detect and locate defective sub-pixels in the display region. FIG. 6 is a diagram of an equivalent circuit of a test circuit. In an exemplary embodiment, a test circuit may include at least one test control signal wire, n1 test data signal wires and m1 test units; at least one of the m1 test units includes n1 test transistors, and m1 and n1 are positive integers greater than or equal to 2. FIG. 6 illustrates an example of a test circuit with a test control signal wire, three test data signal wires and a test unit including of three test transistors. As shown in FIG. 6, among three test transistors 81 of a same test unit 80, the control electrodes of the three test transistors 81 are all connected to a same test control signal wire 82. The first electrodes of the three test transistors 81 are connected to different test data signal wires, namely, a first electrode of a first test transistor is connected to a first test data signal wire 83-1, a first electrode of a second test transistor is connected to a second test data signal wire 83-2, and a first electrode of a third test transistor is connected to a third test data signal wire 83-3. The second electrodes of the three test transistors 81 are connected to different data signal wires DATA in the display region, namely, a second electrode of a first test transistor is connected to a data signal wire DATA, a second electrode of a second test transistor is connected to another data signal wire DATA, and a second electrode of a third test transistor is connected to another data signal wire DATA. In this way, through the test control signal wire 82, the conduction of three test transistors 81 in the test unit 80 can be controlled, and the signals of different test data signal wires can be controlled to be written into different data signal wires. During the test, the control device provides a conduction signal to the test control signal wire 82, and provides the required test data signals to multiple test data signal wires respectively, so that multiple data signal wires in the display region can obtain the test data signals to achieve detection. In an exemplary embodiment, a test control signal wire and a test data signal wire may be disposed in a bezel region, and may be closed loop wiring around the display region.

In an exemplary embodiment, the quantity of data signal wires can be equal to m1*n1, and the color of the sub-pixels connected to each data signal wire is the same. During the test, a same test data signal is provided to the data signal wires corresponding to the sub-pixels of the same color, so that these sub-pixels can be displayed in the same way. The color of the display screen is used to determine whether there are defective sub-pixels and to locate the defective sub-pixels.

Figure 7:
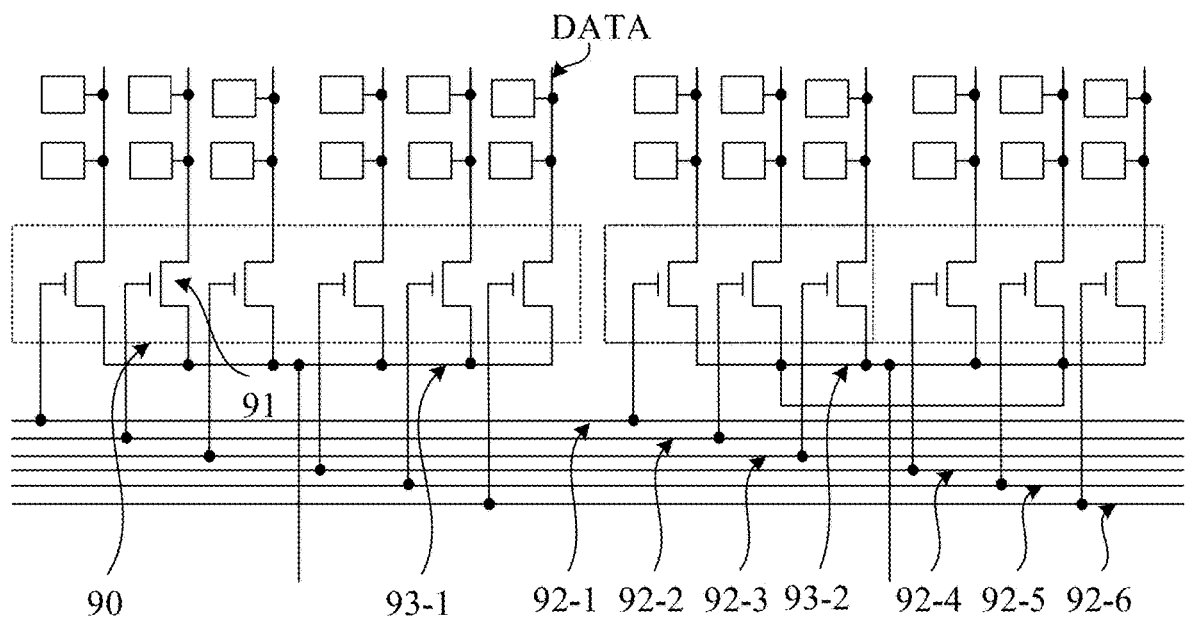
FIG. 7 is a diagram of an equivalent circuit of a multiplexing circuit.

In an exemplary embodiment, multiplexing circuit may include a plurality of multiplexing control signal wires, a plurality of multiplexing data signal wires, and a plurality of multiplexing units, each of the multiplexing units is connected to a plurality of data signal wires in the display region; the multiplexing unit is configured to, according to the control of the plurality of multiplexing control signal wires, provide a signal (data signal) of one multiplexing data signal wire to a plurality of data signal wires connected to the multiplexing unit in a time division manner. FIG. 7 is a diagram of an equivalent circuit of a multiplexing circuit. In an exemplary embodiment, multiplexing circuit may include n2 multiplexing control signal wires, at least one multiplexing data signal wire and m2 multiplexing units 90, at least one of the m2 multiplexing units includes n2 multiplexing transistors, and m2 and n2 are positive integers greater than or equal to 2. FIG. 7 illustrates an example of a multiplexing circuit including six multiplexing control signal wires, two multiplexing data signal wires and a multiplexing unit formed with six multiplexing transistors. As shown in FIG. 7, among the six multiplexing transistors 91 of a same multiplexing unit 90, the control electrodes of the six multiplexing transistors 91 are connected to different multiplexing control signal wires; namely, a control electrode of a first multiplexing transistor is connected to a first multiplexing control signal wire 92-1, a control electrode of a second multiplexing transistor is connected to a second multiplexing control signal wire 92-2, a control electrode of a third multiplexing transistor is connected to a third multiplexing control signal wire 92-3, a control electrode of a fourth multiplexing transistor is connected to a fourth multiplexing control signal wire 92-4, a control electrode of a fifth multiplexing transistor is connected to a fifth multiplexing control signal wire 92-5, and a control electrode of a sixth multiplexing transistor is connected to a sixth multiplexing control signal wire 92-6. First electrodes of the six multiplexing transistors 91 are all connected to the same multiplexing data signal wire, that is, first electrodes of the first to sixth multiplexing transistors in the first multiplexing unit 90 are all connected to the first multiplexing data signal wire 93-1, and the first electrodes of the first to sixth multiplexing transistors in the second multiplexing unit 90 are all connected to the second multiplexing data signal wire 93-2. Second electrodes of the six multiplexing transistors 91 are respectively connected to different data signal wires DATA in the display region, that is, a second electrode of the first multiplexing transistor is connected to one data signal wire DATA in the display region, and a second electrode of the second multiplexing transistor is connected to another data signal wire DATA in the display region, and so on. During display, a control device provides the conduction signal to the six multiplexing control signal wires in a time division manner, so that the six multiplexing transistors 91 in each multiplexing unit 90 are turned on at different time; when any one of the multiplexing transistor 91 is turned on, the multiplexing data signal wire supplies the data signal required by a data signal wire connected to the conducted multiplexing transistor 91, and the data signal wire writes the data signal into the corresponding sub-pixel.

In an exemplary embodiment, the quantity of data signal wires may be equal to m2*n2. By providing multiplexing circuits, one signal source (for example, a pin of the driver chip) can provide data signals for multiple data signal wires, which can greatly reduce the actual quantity of signal sources and simplify the product structure. In an exemplary embodiment, a multiplexing unit 90 may include three multiplexing transistors 91 controlling three data signal wires (one controls three).

In an exemplary embodiment of the present disclosure, a display substrate may include a display region and a bezel region on the periphery of the display region; the bezel region includes a first bezel and a second bezel oppositely disposed in a first direction, a third and a fourth bezel oppositely disposed in a second direction, a first corner connecting a first bezel and a third bezel, a second corner connecting a second bezel and a third bezel, a third corner connecting a first and a fourth bezel, and a fourth corner connecting a second bezel and a fourth bezel; at least one of the first to the fourth corner is an arced corner; the first direction is an extending direction of a scanning signal wire in the display region, and the second direction is an extending direction of a data signal wire in the display region; at least one of the first to the fourth corner is provided with a first wiring and a second wiring, a plurality of first rectangles are enclosed between the first wiring and the second wiring, and a plurality of shift register units are respectively disposed in the plurality of first rectangles.

In an exemplary embodiment, at least one of the first to the fourth corner is further provided with a third wiring, which is disposed between the display region and the second wiring, and a plurality of second rectangles are enclosed between the third wiring and the second wiring.

In an exemplary embodiment, the second rectangle includes long sides and short sides, and the extending direction of the long side of the second rectangle is parallel to the first direction.

In an exemplary embodiment, at least one of the first corner and the second corner is provided with a plurality of first test units, and the plurality of first test units are respectively disposed in the plurality of second rectangles.

In an exemplary embodiment, at least one first test unit is disposed in a same second rectangle in at least one of the first corner and the second corner.

In an exemplary embodiment, at least two shift register units are disposed in a same first rectangle in at least one of the first corner and the second corner.

In an exemplary embodiment, at least one of the third corner and the fourth corner is provided with a plurality of multiplexing units, which are respectively disposed in the plurality of second rectangles.

In an exemplary embodiment, at least one multiplexing unit is disposed in a same second rectangle in at least one of the third corner and the fourth corner.

In an exemplary embodiment, at least one shift register unit is disposed in a same first rectangle in at least one of the third corner and the fourth corner.

In an exemplary embodiment, a data processing circuit may include a first test circuit disposed in at least one of the first corner and the second corner, the first test circuit includes a plurality of first test units connected to at least one data signal wire of the display region and configured to supply a test data signal to the data signal wire. A second test circuit is provided in the third bezel, and the second test circuit includes multiple second test units which are connected to at least one data signal wire of the display region and configured to supply a test data signal to the data signal wire.

In an exemplary embodiment, the first test unit has a height smaller than that of the second test unit, wherein the height is the length along a second direction.

According to an exemplary embodiment of the present disclosure, detection circuits are respectively disposed in a first corner 211, a second corner 212 and a third bezel 203, and multiplexing units of the multiplexing circuit are disposed in at least one of a third corner 213 and a fourth corner 214, so that different circuit units are uniformly distributed, reducing the width of the bezel region and achieving a narrow bezel of a display apparatus.

In an exemplary embodiment, a test circuit may be disposed in a first corner 211 (or second corner 212) and a third bezel 203 in a bezel region 200, and the structure of the test circuit disposed in the first corner 211 (or second corner 212) is different from that of the test circuit disposed in the third bezel 203.

Figure 8:
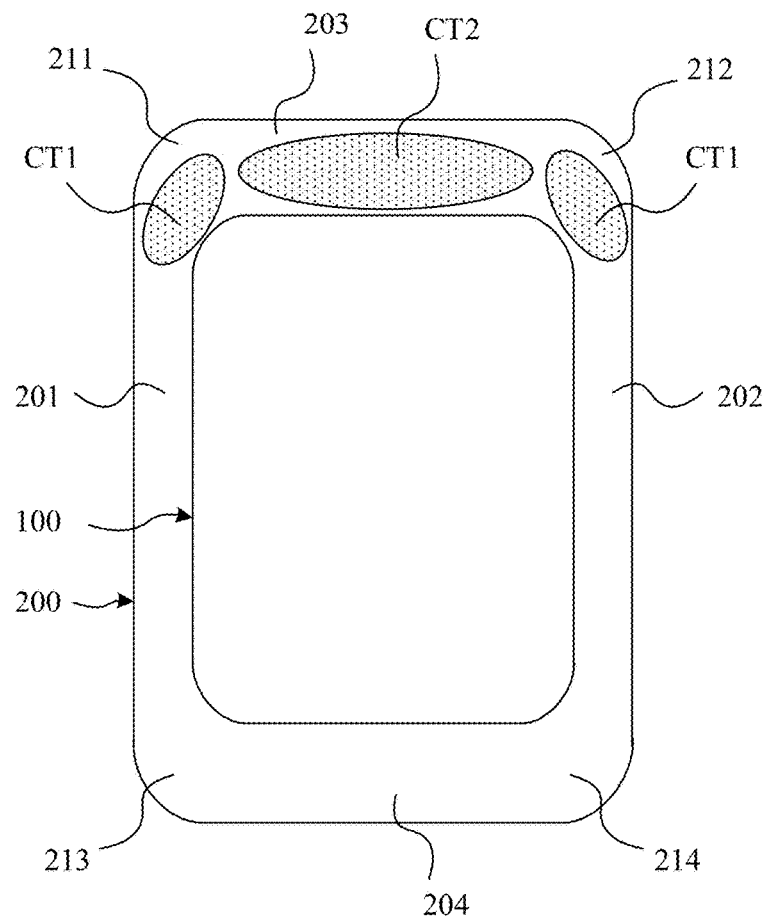
FIG. 8 is a layout of a structure of a test circuit according to an exemplary embodiment of the present disclosure.

FIG. 8 is a layout of a structure of a test circuit according to an exemplary embodiment of the present disclosure. As shown in FIG. 8, in an exemplary embodiment, a test circuit may include a first test circuit CT1 and a second test circuit CT2; the first test circuit CT1 may be disposed in a first corner 211, a second corner 212, or both, and the second test circuit CT2 may be disposed in a third bezel 203; wherein, the first test circuit CT1 has a different structure from the second test circuit CT2. In an exemplary embodiment, a first test circuit CT1 includes a plurality of first test units, and a second test circuit CT2 includes a plurality of second test units; wherein, that a first test unit has a different structure from a second test unit, including that a first test unit has a height smaller than that of a second test unit, and a height is a length along a second direction Y. By arranging the test circuit on the upper bezel and the test circuit in the corners into structures with two different heights, the bezel space of the upper bezel and the corner can be effectively utilized to the maximum extent, reducing the width of the bezel and achieving bezel narrowness.

Figure 9:
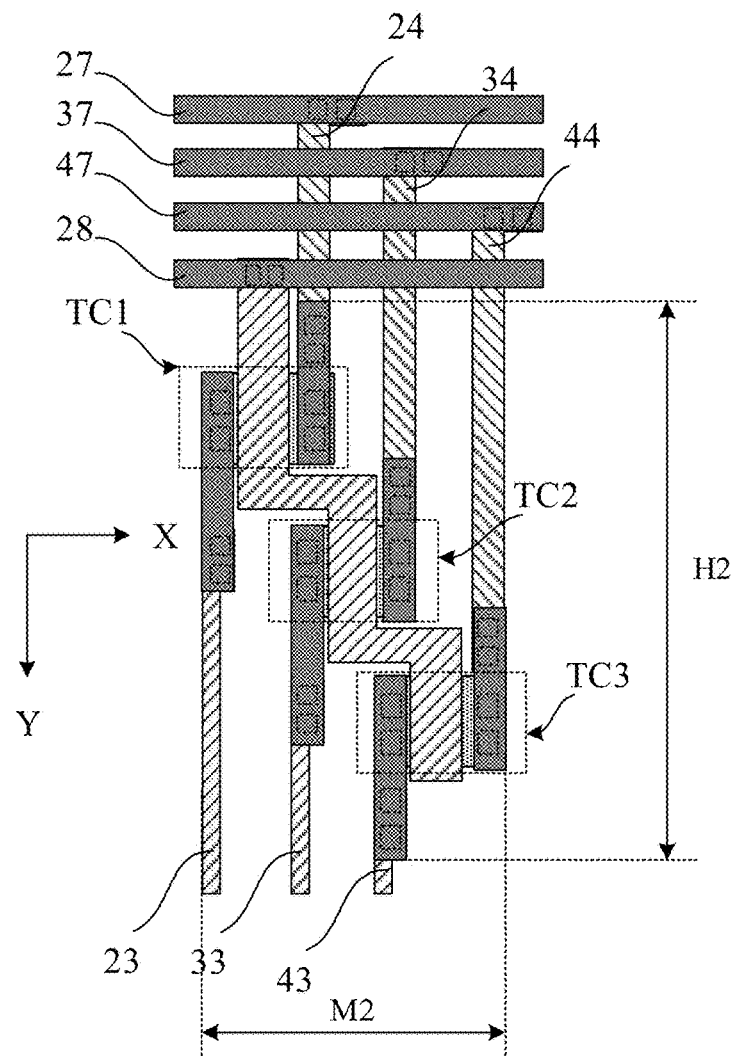
FIG. 9 is a schematic diagram of a structure of a second test unit according to an exemplary embodiment of the present disclosure.

FIG. 9 is a schematic diagram of a structure of a second test unit according to an exemplary embodiment of the present disclosure, illustrating that a second test unit includes three test transistors. As shown in FIG. 9, in a direction parallel to the display substrate, the second test unit includes three test transistors, which are sequentially disposed along a second direction Y and are disposed in a staggered manner in the first direction X. A source electrode (first electrode) of the first test transistor TC1 is connected to a first test data signal wire 27 through a first test connecting wire 24, and a drain electrode (second electrode) of the first test transistor is connected to a data signal wire of the display region through a first test data wire 23. A source electrode (first electrode) of the second test transistor TC2 is connected to a second test data signal wire 37 through a second test connecting wire 34, and a drain electrode (second electrode) of the second test transistor is connected to another data signal wire of the display region through a second test data wire 33. A source electrode (first electrode) of the third test transistor TC3 is connected to a third test data signal wire 47 through a third test connecting wire 44, and a drain electrode (second electrode) of the third test transistor is connected to another data signal wire of the display region through third test data wire 43. A first test gate electrode of the first test transistor TC1, a second test gate electrode of the second test transistor TC2, and a third test gate electrode 42 of the third test transistor TC3 may have an integrated structure connected to each other and connected to a test control signal wire 28.

In an exemplary embodiment, a second test unit may have a rectangular shape and a height (second height H2) greater than its width (second width M2), wherein the second height H2 may be about 2 to 3 times of the second width M2. In an exemplary embodiment of the present disclosure, a width is a length in a first direction X, and a height is a length in a second direction Y.

In an exemplary embodiment, a second test unit has a width M2 of about 44 μm to 66 μm and a height H2 of about 110 μm to 170 μm.

In an exemplary embodiment, a second test unit has a width M2 of about 54.92 μm and a height H2 of about 141.6 μm.

In a direction perpendicular to a display substrate, a second test unit may include: a first insulating layer disposed on a substrate; multiple test active layers disposed on the first insulating layer, wherein the plurality of test active layers are disposed at intervals along a second direction and staggered in a first direction; a second insulating layer covering the plurality of test active layers, and a plurality of test gate electrodes and a plurality of test data wires disposed on the second insulating layer; wherein, the multiple test gate electrodes are disposed at intervals along the second direction and staggered in the first direction; the plurality of test data wires are disposed at intervals along the first direction, first ends of the plurality of test data wires are respectively located at one side of the plurality of test active layers adjacent to the display region, and second ends of the plurality of test data wires extend towards the display region;

a third insulating layer covering the plurality of test gate electrodes and the plurality of test data wires, and plurality of test connecting wires disposed on the third insulating layer at intervals along the first direction; wherein first ends of the plurality of test connecting wires are respectively located on a side of the plurality of test active layers away from the display region, second ends of the test connecting wires extend along a direction away from the display region, distances between the second ends of the plurality of test connecting wires and the edge of the display region are different;

a fourth insulating layer covering the plurality of test connecting wires, on which a plurality of vias are provided; a plurality of test source electrodes and a plurality of test drain electrodes disposed on the fourth insulating layer; the test source electrodes are respectively connected to the corresponding test active layers and the first terminals of the corresponding test connecting wires through the vias, and the second terminals of the test connecting wires are connected to the corresponding test data signal wires through the vias; the test drain electrodes are respectively connected to the corresponding test active layers and the first terminals of the corresponding test data wires through the vias, and the second terminals of the test data wires are connected to the data signal wires of the display region; the plurality of test gate electrodes are connected to test control signal wires through the vias.

The following is an exemplary explanation through a manufacturing process of a second test unit. A "patterning process" mentioned in the present disclosure includes processes such as photoresist coating, mask exposure, development, etching and photoresist stripping for metal materials, inorganic materials or transparent conductive materials, and includes processes such as coating organic materials, mask exposure and development for organic materials. Deposition may be implemented by any one or more of sputtering, the evaporation and chemical vapor deposition, coating may be implemented by any one or more of spraying coating, spin coating and ink-jet printing, and the etching may be implemented by any one or more of dry etching and wet etching, and these are not limited in the present disclosure. A "thin film" refers to a layer of thin film manufactured by a certain material on a substrate by using deposition, coating or another process. If the "thin film" does not need a patterning process during the whole manufacturing process, the "thin film" can also be called a "layer". If the "thin film" needs a patterning process in the whole manufacturing process, it is referred to as a "thin film" before the patterning process and as a "layer" after the patterning process. The "layer" after the patterning process contains at least one "pattern". In the present disclosure, "A and B are disposed on the same layer" indicates that A and B are simultaneously formed by the same patterning process, and a "thickness" of the film layer is the dimension of the film layer in a direction perpendicular to the display substrate. Herein, "an orthographic projection of A including an orthographic projection of B" or "an orthographic projection of B is located within the range of an orthographic projection of A" means that the boundary of the orthographic projection of B falls within the range of the boundary of the orthographic projection of A, or the boundary of the orthographic projection of A overlaps with the boundary of the orthographic projection of B.

In an exemplary embodiment, the manufacturing process of a second test unit may include the following operations.

Figure 10:
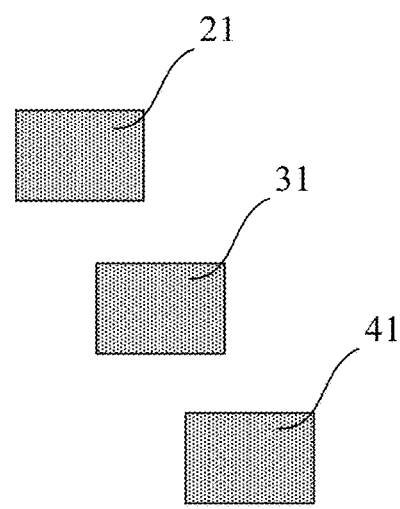
FIG. 10 to FIG. 14 are schematic diagrams of the manufacturing of a second test unit according to exemplary embodiments of the present disclosure.

(1) Forming a pattern of a semiconductor layer on a substrate. In an exemplary embodiment, forming a pattern of a semiconductor layer on a substrate may include: sequentially depositing a first insulating film and a semiconductor film on the substrate, and patterning the semiconductor film through a patterning process to form a first insulating layer covering the entire substrate and a pattern of a semiconductor layer disposed on the first insulating layer; the pattern of a semiconductor layer includes at least a first test active layer 21, a second test active layer 31, and a third test active layer 41, as shown in FIG. 10. In an exemplary implementation, the substrate may be a flexible substrate or may be a rigid substrate. In an exemplary embodiment, three test active layers are disposed at intervals along a second direction Y and staggered in the first direction X; the width of the three test active layers in the first direction X may be about 20 μm to 25 μm, and the height in the second direction Y may be about 13 μm to 19 μm. In an exemplary embodiment, each test active layer may have a width of about 22.9 μm and a height of about 16 μm.

Figure 11:
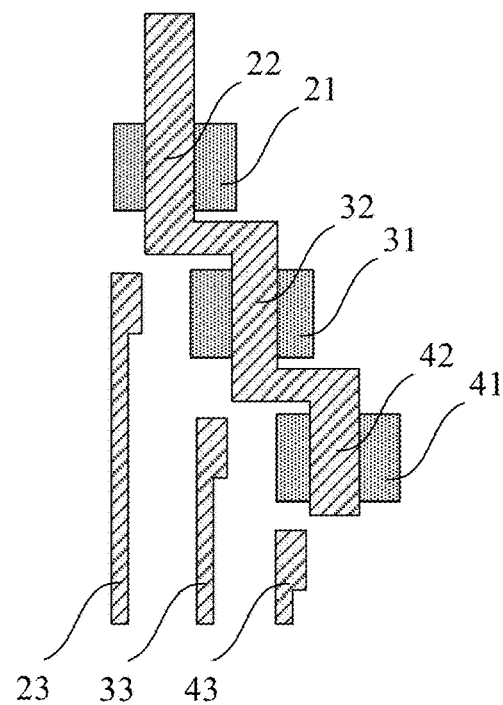

(2) Forming a pattern of a first metal layer. In an exemplary embodiment, forming a pattern of a first metal layer may include: sequentially depositing a second insulating film and a first metal film on the substrate on which the aforementioned pattern is formed, and patterning the first metal film through a patterning process to form a second insulating layer covering the pattern of the semiconductor layer and a pattern of the first metal layer disposed on the second insulating layer; the pattern the first metal layer includes at least a first test gate electrode 22, a second test gate electrode 32, a third test gate electrode 42, a first test data wire 23, a second test data wire 33 and a third test data wire 43, as shown in FIG. 11. In an exemplary embodiment, three test gate electrodes are disposed at intervals along a second direction Y and staggered in a first direction X, and the width of the three test gate electrodes in the first direction X may be about 8 μm to 11 μm. In an exemplary embodiment, each test gate electrode may have a width about 9.3 μm. In an exemplary embodiment, three test data wires are disposed at intervals along a first direction X, first ends of the three test data wires are respectively located on one side of the three test active layers adjacent to the display region, and second ends of the three test data wires extend in a direction towards the display region (second direction Y). In an exemplary embodiment, a first test gate electrode 22, a second test gate electrode 32, and a third test gate electrode 42 may be an integrated structure in which they are connected with each other. The first test gate electrode 22, the second test gate electrode 32, and the third test gate electrode 42 are configured to be connected to the subsequently formed test control signal wires, the first test data wire 23, the second test data wire 33, and the third test data wire 43 are configured to be connected to data signal wires of the display region, respectively.

Figure 12:
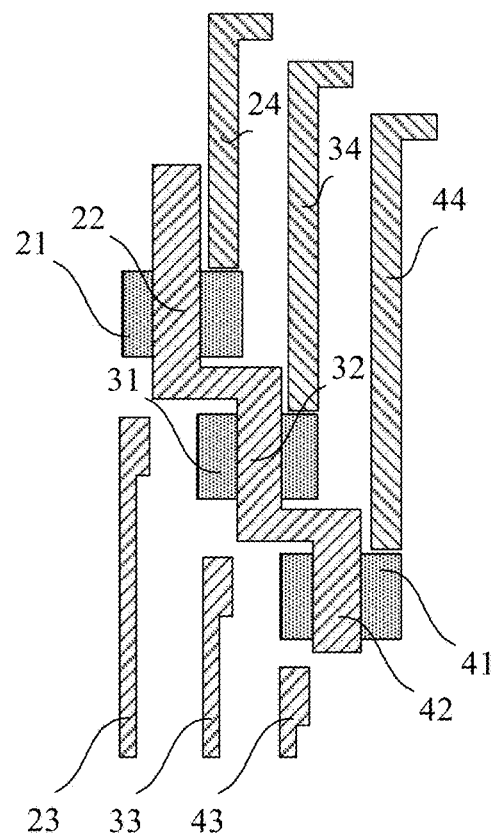

(3) Forming a pattern of a second metal layer. In an exemplary embodiment, forming a pattern of a second metal layer may include: sequentially depositing a third insulating film and a second metal film on the substrate on which the aforementioned patterns are formed, and patterning the second metal film through a patterning process to form a third insulating layer covering the pattern of the first metal layer, and a pattern of the second metal layer disposed on the third insulating layer, the second metal layer pattern includes at least a first test connecting wire 24, a second test connecting wire 34, and a third test connecting wire 44, as shown in FIG. 12. In an exemplary embodiment, first ends of the three test connecting wires are respectively located on a side of the three test active layers away from a display region, second ends of the three test connecting wires extend along a direction away from the display region, and the second ends of the three test connecting wires are at a different distance from the edge of the display region. In an exemplary embodiment, a first test connecting wire 24, a second test connecting wire 34, and a third test connecting wire 44 are configured to connect subsequently formed test data signal wires, respectively.

(4) Forming a pattern of a fourth insulating layer. In an exemplary embodiment, forming a pattern of a fourth insulating layer may include: depositing a fourth insulating film on the substrate on which the aforementioned patterns are formed, and patterning the fourth insulating film through a patterning process to form a fourth insulating layer covering the pattern of the second metal layer, and a plurality of vias are provided on the fourth insulating layer, as shown in FIG.

13. In an exemplary embodiment, the plurality of vias on the fourth insulating layer may include: a first test via V1 located on a side of the first test gate electrode 22 adjacent to the first test data wire 23 and exposing the first test active layer 21, a second test via V2 located on a side of the first test gate electrode 22 adjacent to the first test connecting wire 24 and exposing the first test active layer 21, a third test via V3 located on a side of the second test gate electrode 32 adjacent to the second test data wire 33 and exposing the second test active layer 31, a fourth test via V4 located on a side of the second test gate electrode 32 adjacent to the second test connecting wire 34 and exposing the second test active layer 31, a fifth test via V5 located on a side of the third test gate electrode 42 adjacent to the third test data wire 43 and exposing the third test active layer 41, a sixth test via V6 located on a side of the third test gate electrode 42 adjacent to the third test connecting wire 44 and exposing the third test active layer 41, a seventh test via V7 located on a first end of the first test data wire 23 adjacent to the first test active layer 21 and exposing the first test data wire 23, an eighth test via V8 located on a first end of the second test data wire 33 adjacent to the second test active layer 31 and exposing the second test data wire 33, a ninth test via V9 located on a first end of the third test data wire 43 adjacent to the third test active layer 41 and exposing the third test data wire 43, a tenth test via V10 located on a first end of the first test connecting wire 24 adjacent to the first test active layer 21 and exposing the first test connecting wire 24, an eleventh test via V11 located on a first end of the second test connecting wire 34 adjacent to the second test active layer 31 and exposing the second test connecting wire 34, a twelfth test via V12 located on a first end of the third test connecting wire 44 adjacent to the third test active layer 41 and exposing the third test connecting wire 44, a thirteenth test via V13 located on an end of the first test connecting wire 24 away from the first test active layer 21 and exposing the first test connecting wire 24, a fourteenth test via V14 located on a second end of the second test connecting wire 34 away from the second test active layer 31 and exposing the second test connecting wire 34, a fifteenth test via V15 located on a second end of the third test connecting wire 44 away from the third test active layer 41 and exposing the third test connecting wire 44, and a sixteenth test via V16 located on a second end of the first test gate electrode 22 away from the display region and exposing the first test gate electrode 22.

Figure 14:
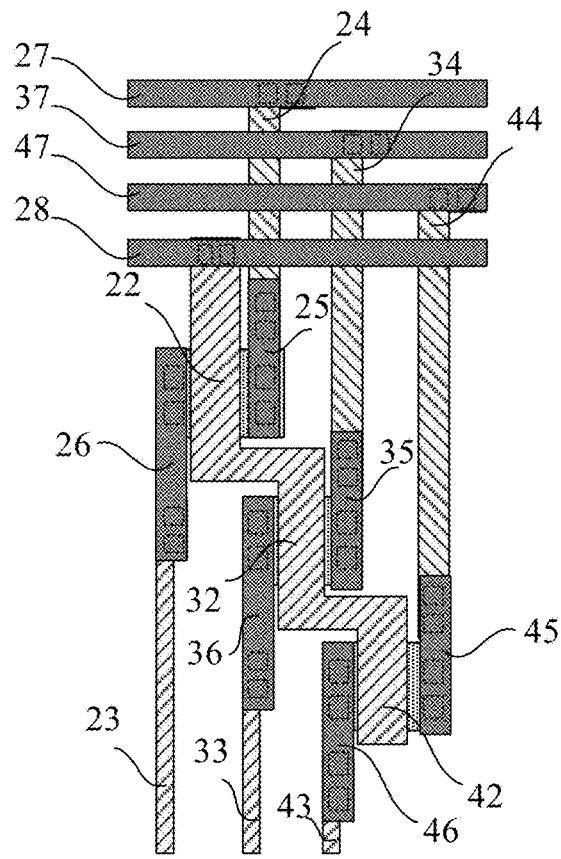

(5) Forming a pattern of a third metal layer. In an exemplary embodiment, forming a pattern of a third metal layer may include: depositing a third metal film on the substrate on which the aforementioned patterns are formed, patterning the third metal film through a patterning process, forming a pattern of the third metal layer on a fourth insulating layer, and the pattern of the third metal layer at least includes: a first test source electrode 25, a first test drain electrode 26, a second test source electrode 35, a second test drain electrode 36, a third test source electrode 45, a third test drain electrode 46, a first test data signal wire 27, a second test data signal wire 37, a first test data signal wire 47 and a test control signal wire 28, as shown in FIG. 14.

In an exemplary embodiment, one terminal of the first test drain electrode 26 is connected to a first test active layer 21 through a first test via V1, the other terminal is connected to a first end of a first test data wire 23 through a seventh test via V7, and the second end of the first test data wire 23 is connected to a data signal wire in the display region. One end of a first test source electrode 25 is connected to the first test active layer 21 through a second test via V2, the other end is connected to a first end of a first test connecting wire 24 through a tenth test via V10, and a second end of the first test connecting wire 24 is connected to a first test data signal wire 27 through a thirteenth test via V13. One terminal of a second test drain electrode 36 is connected to a second test active layer 31 through a third test via V3, the other terminal is connected to a first end of a second test data wire 33 through an eighth test via V8, and the second end of the second test data wire 33 is connected to a data signal wire in the display region. One terminal of a second test source electrode 35 is connected to a second test active layer 31 through a fourth test via V4, the other terminal is connected to a first end of a second test connecting wire 34 through a eleventh test via V11, and a second end of the second test connecting wire 34 is connected to a second test data signal wire 37 through a fourteenth test via V14. One terminal of a third test drain electrode 46 is connected to a third test active layer 41 through a fifth test via V5, the other terminal is connected to a first end of a third test data wire 43 through a ninth test via V9, and the second end of the third test data wire 43 is connected to a data signal wire in the display region. One terminal of a third test source electrode 45 is connected to the third test active layer 41 through a sixth test via V6, the other terminal is connected to a first end of a third test connecting wire 44 through a twelfth test via V12, and a second end of the third test connecting wire 44 is connected to a third test data signal wire 47 through a fifteenth test via V15. A first test gate electrode 22 is connected to a test control signal wire 28 through a sixteenth test via V16.

In an exemplary embodiment, a distance between a side edge of a first test source electrode 25 away from a first test active layer 21 and a side edge of a first test drain electrode 26 away from the first test active layer 21 may be about 20 μm to 25 μm, a distance between a side edge of a second test source electrode 35 away from a second test active layer 31 and a side edge of a second test drain electrode 36 away from the second test active layer 31 may be about 20 μm to 25 μm, a distance between a side edge of a third test source electrode 45 away from a third test active layer 41 and a side edge of a third test drain electrode 46 away from the third test active layer 41 may be about 20 μm to 25 μm. In an exemplary embodiment, a distance between a side edge of each test source electrode and a side edge of a test drain electrode may be about 22.9 μm.

In an exemplary embodiment, a first test active layer 21, a first test gate electrode 22, a first test source electrode 25, and a first test drain electrode 26 form a first test transistor TC1, a second test active layer 31, a first test gate electrode 32, a second test source electrode 35, and a second test drain electrode 36 form a second test transistor TC2, a third test active layer 41, a third test gate electrode 42, a third test source electrode 45, and a third test drain electrode 46 form a third test transistor TC3, and the first test transistor TC1, the second test transistor TC2 and the third test transistor TC3 form a test unit. The first test gate electrode 22, the second test gate electrode 32 and the third test gate electrode 42 are all connected to a same test control signal wire 28; a first test drain electrode 26, a second test drain electrode 36 and a third test drain electrode 46 are respectively connected to different data signal wires in the display region through a first test data wire 23, a second test data wire 33 and a third test data wire 43; and the first test source electrode 25, the second test source electrode 35, and the third test source electrode 45 are respectively connected to a first test data signal wire 27, a second test data signal wire 37 and a first test data signal wire 47 through a first test connecting wire 24, a second test connecting wire 34, and a third test connecting wire 44, respectively. During the test, the control device provides a conduction signal to the test control signal wire 28 to control the first test transistor TC1, the second test transistor TC2 and the third test transistor TC3 to conduct, and the test data signals provided by the first test data signal wire 27, the second test data signal wire 37 and the first test data signal wire 47 are transmitted to a plurality of data signal wires in the display region.

The structure of the second test unit shown in the present disclosure and the manufacturing process thereof are merely an exemplary description. In an exemplary implementation, corresponding structures may be changed and patterning processes may be added or reduced according to actual needs. For example, a test connecting wire may be disposed in a first metal layer and a test data wire may be disposed in a second metal layer. For another example, a test gate electrode, a test connecting wire and a test data wire may be disposed on a same layer and formed through a same patterning process. For another example, other electrodes, leads, and film layers may be disposed in the second test unit, and the present application is not limited thereto.

Figure 15:
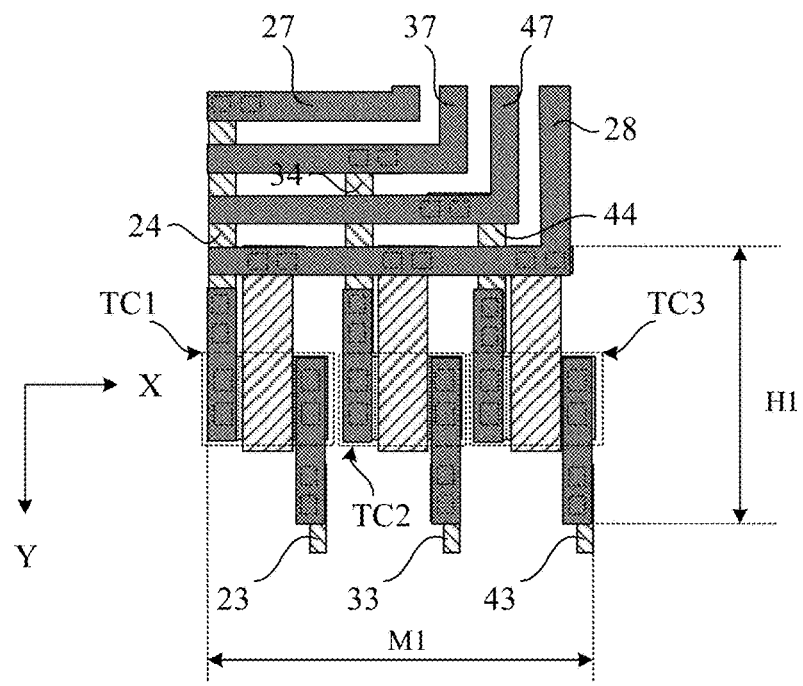
FIG. 15 is a schematic diagram of a structure of a first test unit according to an exemplary embodiment of the present disclosure.

FIG. 15 is a schematic diagram of a structure of a first test unit according to an exemplary embodiment of the present disclosure, showing a first test unit including three test transistors. As shown in FIG. 15, in a direction parallel to the display substrate, a first test unit includes three test transistors, which are sequentially disposed along a first direction X and are flush in a second direction Y. A source electrode (first electrode) of the first test transistor TC1 is connected to a first test data signal wire 27 through a first test connecting wire 24, and a drain electrode (second electrode) of the first test transistor is connected to a data signal wire of the display region through a first test data wire 23. A source electrode (first electrode) of the second test transistor TC2 is connected to a second test data signal wire 37 through a second test connecting wire 34, and a drain electrode (second electrode) of the second test transistor is connected to another data signal wire of the display region through a second test data wire 33. A source electrode (first electrode) of the third test transistor TC3 is connected to a third test data signal wire 47 through a third test connecting wire 44, and a drain electrode (second electrode) of the third test transistor is connected to another data signal wire of the display region through a third test data wire 43. A test gate electrode of the first test transistor TC1, a test gate electrode of the second test transistor TC2, and a test gate electrode 42 of the third test transistor TC3 are all connected to a same test control signal wire 28.

In an exemplary embodiment, a first test unit may be rectangular, and may have a height (first height H1) greater than its width (first width M1), or, the first test unit may have a first height H1 smaller than or equal to a first width M1, the first height H1 may be about 0.9 to 1.3 times the first width M1.

In an exemplary embodiment, a height H2 of a second test unit may be about 1.5 times to 4 times a height H1 of a first test unit.

In an exemplary embodiment, a first test unit may have a width M1 of about 60 μm to 90 μm and a height H1 of about 70 μm to 100 μm.

In an exemplary embodiment, a first test unit may have a first width M1 of about 750.7 μm and a height H1 of about 84.78 μm.

In a direction perpendicular to a display substrate, a first test unit may include:

a first insulating layer disposed on a substrate;

a plurality of test active layers disposed on the first insulating layer, wherein the plurality of test active layers are disposed at intervals along a first direction and flush in the second direction;

a second insulating layer covering the plurality of test active layers, and a plurality of test gate electrodes and a plurality of test data wires disposed on the second insulating layer; wherein, the plurality of test gate electrodes are disposed at intervals along the first direction and flush in the second direction; the plurality of test data wires are disposed at intervals along the first direction, first ends of the plurality of test data wires are respectively located at one side of the plurality of test active layers adjacent to the display region, and second ends of the plurality of test data wires extend towards the display region;

a third insulating layer covering the plurality of test gate electrodes and the plurality of test data wires, and a plurality of test connecting wires disposed on the third insulating layer at intervals along the first direction; wherein first ends of the plurality of test connecting wires are respectively located on a side of the plurality of test active layers away from the display region, second ends of the test connecting wires extend along a direction away from the display region, and the second ends of the plurality of test connecting wires are at different distances from the edge of the display region;

a fourth insulating layer covering the plurality of test connecting wires, on which a plurality of vias are provided;

a plurality of test source electrodes and a plurality of test drain electrodes disposed on the fourth insulating layer; the test source electrodes are respectively connected to the corresponding test active layers and the first ends of the corresponding test connecting wires through the vias, and the second ends of the test connecting wires are connected to the corresponding test data signal wires through the vias; the test drain electrodes are respectively connected to the corresponding test active layers and the first ends of the corresponding test data wires through the vias, and the second ends of the test data wires are connected to the data signal wires of the display region; the plurality of test gate electrodes are connected to test control signal wires through the vias.

In an exemplary embodiment, the manufacturing process of a first test unit may include the following operations.

(11) Forming a pattern of a semiconductor layer on a substrate. In an exemplary embodiment, forming a pattern of a semiconductor layer on a substrate may include: sequentially depositing a first insulating film and a semiconductor film on the substrate, and patterning the semiconductor film through a patterning process to form a first insulating layer covering the entire substrate and a pattern of a semiconductor layer disposed on the first insulating layer; the pattern of a semiconductor layer includes at least a first test active layer 21, a second test active layer 31, and a third test active layer 41, as shown in FIG. 16.

Figure 16:
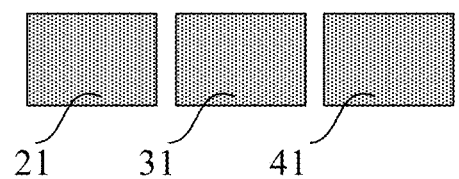
FIG. 16 to FIG. 20 are schematic diagrams of the manufacturing of a first test unit according to exemplary embodiments of the present disclosure.

As shown in FIG. 10 and FIG. 16, three test active layers in the second test unit are disposed at intervals along a second direction Y and staggered in a first direction X, while three test active layers in the first test unit are disposed at intervals along the first direction X and are flush in the second direction Y, so the size of the first test circuit in the second direction Y can be effectively reduced. In an exemplary embodiment, the width of the three test active layers in the first direction X may be about 20 μm to 25 μm, and the height in the second direction Y may be about 13 µm to 19 µm. In an exemplary embodiment, each test active layer may have a width of about 22.9 µm and a height of about 16 µm. In an exemplary embodiment, the three test active layers may have a same width, height, and spacing between adjacent test active layers in the first test unit and the second test unit to ensure the consistency of test effects.

(12) Forming a pattern of a first metal layer. In an exemplary embodiment, forming a pattern of a first metal layer may include: sequentially depositing a second insulating film and a first metal film on the substrate on which the aforementioned patterns are formed, and patterning the first metal film through a patterning process to form a second insulating layer covering the pattern of the semiconductor layer and a pattern of the first metal layer disposed on the second insulating layer; the pattern the first metal layer includes at least a first test gate electrode 22, a second test gate electrode 32, a third test gate electrode 42, a first test data wire 23, a second test data wire 33 and a third test data wire 43, as shown in FIG. 17.

Figure 17:
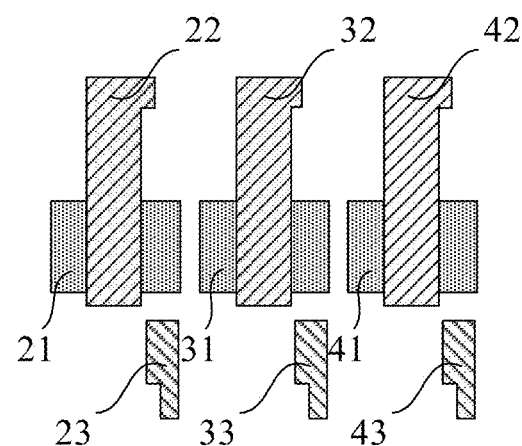

As shown in FIG. 11 and FIG. 17, three test gate electrodes in a second test unit are disposed at intervals along a second direction Y and staggered in a first direction X, while three test gate electrodes in a first test unit are disposed at intervals along the first direction X and are flush in the second direction Y, and the size of the first test circuit in the second direction Y can be effectively reduced. In an exemplary embodiment, the three test gate electrodes may have widths of about 8 µm to 11 µm in a first direction X. In an exemplary embodiment, each test gate electrode may have a width about 9.3 µm. In an exemplary embodiment, the three test gate electrodes may have a same width and same spacing between adjacent test gate electrodes in the first test unit and the second test unit to ensure the consistency of test effects. In an exemplary embodiment, three test data wires are disposed at intervals along a first direction X, first ends of the three test data wires are respectively located on one side of the three test active layers adjacent to the display region, second ends of the three test data wires extend in a direction towards the display region, and the second ends of the three test data wires are flush in a second direction Y.

Figure 18:
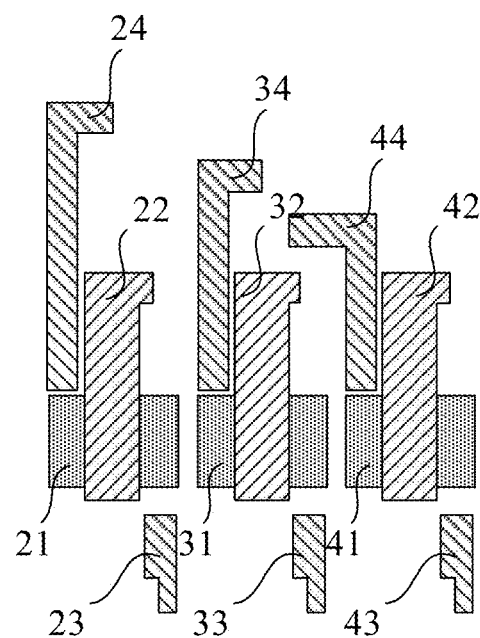

(13) Forming a pattern of a second metal layer. In an exemplary embodiment, forming a pattern of a second metal layer may include: sequentially depositing a third insulating film and a second metal film on the substrate on which the aforementioned patterns are formed, and patterning the second metal film through a patterning process to form a third insulating layer covering the pattern of the first metal layer, and a pattern of the second metal layer disposed on the third insulating layer, the second metal layer pattern includes at least a first test connecting wire 24, a second test connecting wire 34, and a third test connecting wire 44, as shown in FIG. 18. In an exemplary embodiment, first ends of the three test connecting wires are respectively located on a side of the three test active layers away from a display region, second ends of the three test connecting wires extend along a direction away from the display region, and the second ends of the three test connecting wires are at different distances from the edge of the display region. As shown in FIGS. 12 and 18, first ends of the three test connecting wires in a second test unit are disposed at intervals along a second direction Y, while first ends of the three test connecting wires in a first test unit are flush in the second direction Y, thus the size of the first test circuit in the second direction Y can be effectively reduced.

Figure 19:
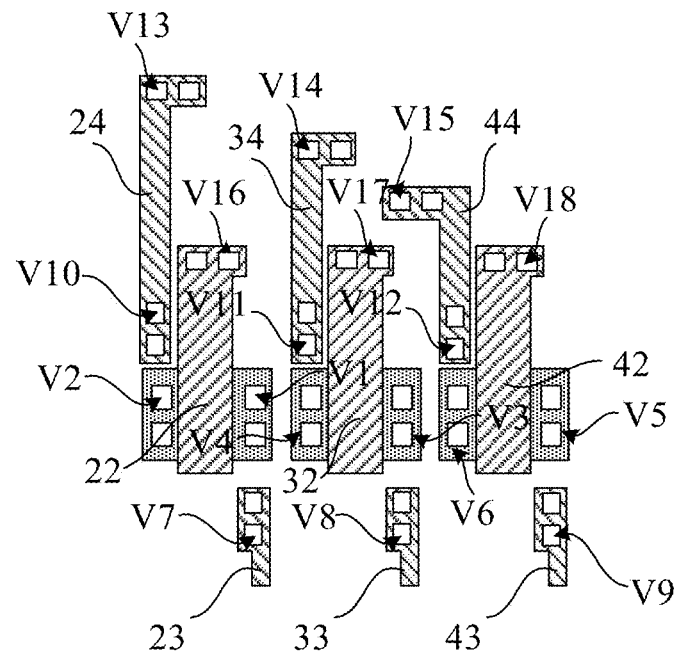

(14) Forming a pattern of a fourth insulating layer. In an exemplary embodiment, forming a pattern of a fourth insulating layer may include: depositing a fourth insulating film on the substrate on which the aforementioned patterns are formed, and patterning the fourth insulating film through a patterning process to form a fourth insulating layer covering the pattern of the second metal layer, and a plurality of vias are provided on the fourth insulating layer, as shown in FIG. 19. In an exemplary embodiment, the plurality of vias on the fourth insulating layer may include: a first test via V1 located on a side of the first test gate electrode 22 adjacent to the first test data wire 23 and exposing the first test active layer 21, a second test via V2 located on a side of the first test gate electrode 22 adjacent to the first test connecting wire 24 and exposing the first test active layer 21, a third test via V3 located on a side of the second test gate electrode 32 adjacent to the second test data wire 33 and exposing the second test active layer 31, a fourth via V4 located on a side of the second test gate electrode 32 adjacent to the second test connecting wire 34 and exposing the second test active layer 31, a fifth test via V5 located on a side of the third test gate electrode 42 adjacent to the third test data wire 43 and exposing the third test active layer 41, a sixth via V6 located on a side of the third test gate electrode 42 adjacent to the third test connecting wire 44 and exposing the third test active layer 41, a seventh test via V7 located on a first end of the first test data wire 23 adjacent to the first test active layer 21 and exposing the first test data wire 23, an eighth test via V8 located on a first end of the second test data wire 33 adjacent to the second test active layer 31 and exposing the second test data wire 33, a ninth test via V9 located on a first end of the third test data wire 43 adjacent to the third test active layer 41 and exposing the third test data wire 43, a tenth test via V10 located on a first end of the first test connecting wire 24 adjacent to the first test active layer 21 and exposing the first test connecting wire 24, an eleventh test via V11 located on a first end of the second test connecting wire 34 adjacent to the second test active layer 31 and exposing the second test connecting wire 34, a twelfth test via V12 located on a first end of the third test connecting wire 44 adjacent to the third test active layer 41 and exposing the third test connecting wire 44, a thirteenth test via V13 located on a second end of the first test connecting wire 24 away from the first test active layer 21 and exposing the first test connecting wire 24, a fourteenth test via V14 located on a second end of the second test connecting wire 34 away from the second test active layer 31 and exposing the second test connecting wire 34, a fifteenth test via V15 located on a second end of the third test connecting wire 44 away from the third test active layer 41 and exposing the third test connecting wire 44, a sixteenth test via V16 located on an end of the first test gate electrode 22 away from the first test active layer 21 and exposing the first test gate electrode 22, a seventeenth test via V17 located on an end of the second test gate electrode 32 away from the second test active layer 31 and exposing the second test gate electrode 32, and an eighteenth test via V18 located on an end of the third test gate electrode 42 away from the third test active layer 41 and exposing the third test gate electrode 42.

Figure 13:
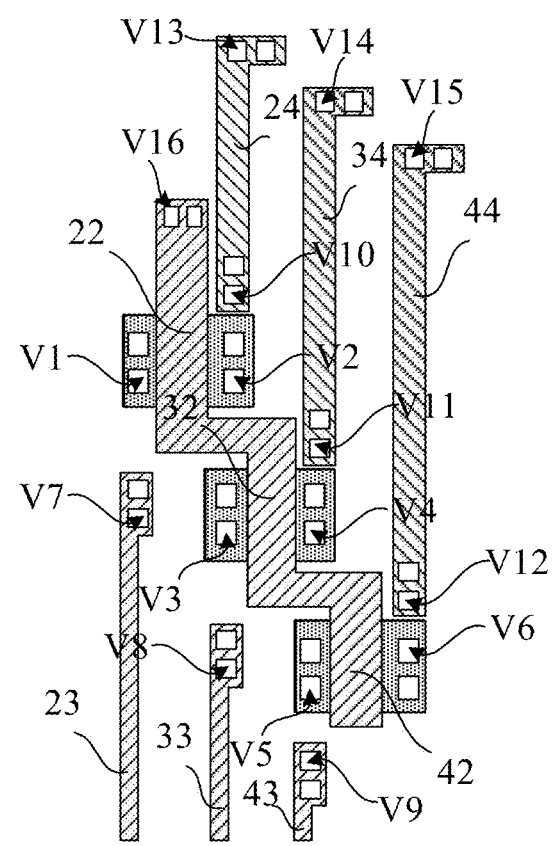

As shown in FIG. 13 and FIG. 19, since the three test gate electrodes in the second test circuit form an integrated structure that is connected to each other, only one test via is needed to connect the test control signal wire with the three test gate electrodes. And since the three test gate electrodes in the first test circuit are isolated from each other, it is needed to provide a sixteenth test via V16, a seventeenth test via V17 and an eighteenth test via V18 to achieve the connection between the test control signal wire and the three test gate electrodes.

Figure 20:
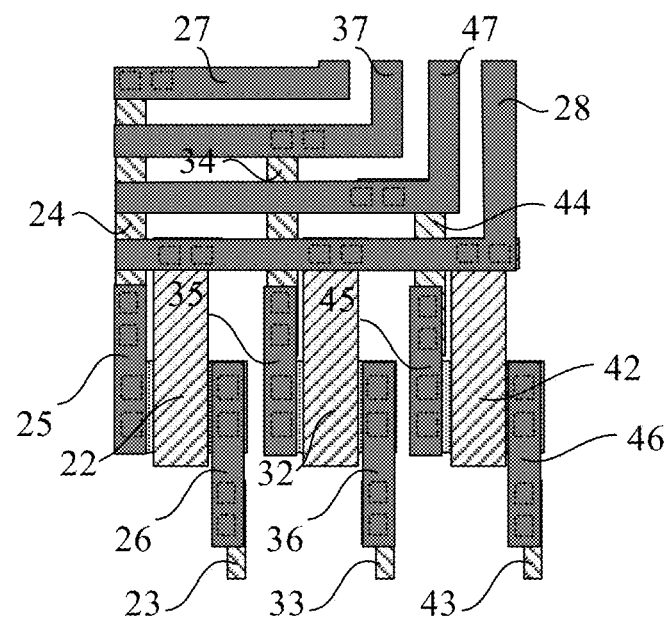

(15) Forming a pattern of a third metal layer. In an exemplary embodiment, forming a pattern of a third metal layer may include: depositing a third metal film on the substrate on which the aforementioned patterns are formed, patterning the third metal film through a patterning process, forming a pattern of the third metal layer on a fourth insulating layer, and the pattern of the third metal layer at least includes: a first test source electrode 25, a first test drain electrode 26, a second test source electrode 35, a second test drain electrode 36, a third test source electrode 45, a third test drain electrode 46, a first test data signal wire 27, a second test data signal wire 37, a first test data signal wire 47 and a test control signal wire 28, as shown in FIG. 20.

In an exemplary embodiment, one end of a first test drain electrode 26 is connected to a first test active layer 21 through a first test via V1, the other end is connected to a first end of a first test data wire 23 through a seventh test via V7, and the second end of the first test data wire 23 is connected to a data signal wire in the display region. One end of a first test source electrode 25 is connected to the first test active layer 21 through a second test via V2, the other end is connected to a first end of a first test connecting wire 24 through a tenth test via V10, and a second end of the first test connecting wire 24 is connected to a first test data signal wire 27 through a thirteenth test via V13. One end of a second test drain electrode 36 is connected to a second test active layer 31 through a third test via V3, the other end is connected to a first end of a second test data wire 33 through an eighth test via V8, and the second end of the second test data wire 33 is connected to a data signal wire in the display region. One end of a second test source electrode 35 is connected to a second test active layer 31 through a fourth test via V4, the other end is connected to a first end of a second test connecting wire 34 through a eleventh test via V11, and a second end of the second test connecting wire 34 is connected to a second test data signal wire 37 through a fourteenth test via V14. One end of a third test drain electrode 46 is connected to a third test active layer 41 through a fifth test via V5, the other end is connected to a first end of a third test data wire 43 through a ninth test via V9, and the second end of the third test data wire 43 is connected to a data signal wire in the display region. One end of a third test source electrode 45 is connected to the third test active layer 41 through a sixth test via V6, the other end is connected to a first end of a third test connecting wire 44 through a twelfth test via V12, and a second end of the third test connecting wire 44 is connected to a third test data signal wire 47 through a fifteenth test via V15. A first test gate electrode 22 is connected to a test control signal wire 28 through a sixteenth test via V16, a second test gate electrode 32 is connected to the test control signal wire 28 through a seventeenth test via V17, and a third test gate electrode 42 is connected to the test control signal wire 28 through an eighteenth test via V18.

In an exemplary embodiment, a distance between a side edge of a first test source electrode 25 away from a first test active layer 21 and a side edge of a first test drain electrode 26 away from the first test active layer 21 may be about 20 μm to 25 μm, a distance between a side edge of a second test source electrode 35 away from a second test active layer 31 and a side edge of a second test drain electrode 36 away from the second test active layer 31 may be about 20 μm to 25 μm, a distance between a side edge of a third test source electrode 45 away from a third test active layer 41 and a side edge of a third test drain electrode 46 away from the third test active layer 41 may be about 20 μm to 25 μm. In an exemplary embodiment, a distance between a side edge of a test source electrode and a side edge of a test drain electrode may be about 22.9 μm. In an exemplary embodiment, the three test source electrodes and the three test drain electrodes in the first test unit and the second test unit may have a same size to ensure the consistency of test effects.

In an exemplary embodiment, a first test active layer 21, a first test gate electrode 22, a first test source electrode 25, and a first test drain electrode 26 form a first test transistor TC1, a second test active layer 31, a first test gate electrode 32, a second test source electrode 35, and a second test drain electrode 36 form a second test transistor TC2, a third test active layer 41, a first test gate electrode 42, a third test source electrode 45, and a third test drain electrode 46 form a third test transistor TC3, and the first test transistor TC1, the second test transistor TC2 and the third test transistor TC3 form a test unit. The first test gate electrode 22, the second test gate electrode 32 and the third test gate electrode 42 are all connected to a same test control signal wire 28; a first test drain electrode 26, a second test drain electrode 36 and a third test drain electrode 46 are respectively connected to different data signal wires in the display region through a first test data wire 23, a second test data wire 33 and a third test data wire 43; and the first test source electrode 25, the second test source electrode 35, and the third test source electrode 45 are respectively connected to a first test data signal wire 27, a second test data signal wire 37 and a first test data signal wire 47 through a first test connecting wire 24, a second test connecting wire 34, and a third test connecting wire 44, respectively. During the test, the control device provides a conduction signal to the test control signal wire 28 to control the first test transistor TC1, the second test transistor TC2 and the third test transistor TC3 to conduct, and the test data signals provided by the first test data signal wire 27, the second test data signal wire 37 and the first test data signal wire 47 are transmitted to a plurality of data signal wires in the display region.

The structure of the first test circuit shown in the present disclosure and the manufacturing process thereof are merely an exemplary description. In an exemplary implementation, corresponding structures may be changed and patterning processes may be added or reduced according to actual needs. For example, a test connecting wire may be disposed in a first metal layer and a test data wire may be disposed in a second metal layer. For another example, a test gate electrode, a test connecting wire and a test data wire may be disposed on a same layer and formed through a same patterning process. For another example, other electrodes, leads, and film layers may be disposed in the first test circuit, and the present application is not limited thereto.

In an exemplary embodiment, a first test unit and a second test unit may be simultaneously formed by a same manufacturing process. A semiconductor layer pattern of the first test unit and a semiconductor layer pattern of the second test unit are disposed in a same layer and formed by a same patterning process, a first metal layer pattern of the first test unit and a first metal layer pattern of the second test unit are disposed in a same layer and formed by a same patterning process, a second metal layer pattern of the first test unit and a second metal layer pattern of the second test unit are disposed in a same layer and formed by a same patterning process, a fourth insulating layer via pattern of the first test unit and a fourth insulating layer via pattern of the second test unit are disposed in a same layer and formed by a same patterning process, and a third metal layer pattern of the first test unit and a third metal layer pattern of the second test unit are disposed in a same layer and formed by a same patterning process, the present disclosure are not limited here.

Figure 21:
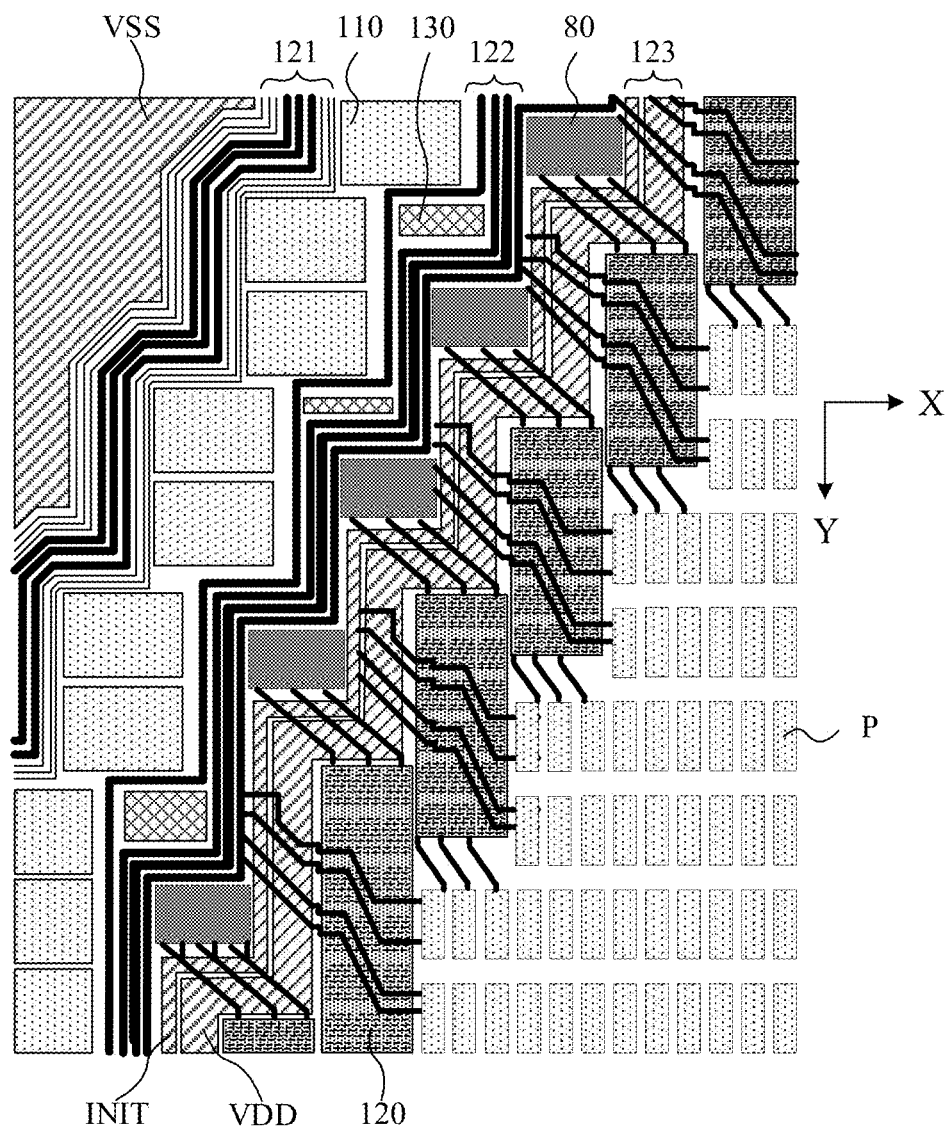
FIG. 21 is a layout of a structure of a first test unit according to an exemplary embodiment of the present disclosure.

FIG. 21 is a layout of a structure of a first test unit according to an exemplary embodiment of the present disclosure. As shown in FIG. 21, in an exemplary embodiment, a display substrate of a rectangular shape with rounded chamfers includes a display region and a bezel region, wherein the display region includes a plurality of sub-pixels P disposed in a matrix manner, and a test circuit (CT), a gate drive circuit (Gate driver On Array (GOA) for example) and corresponding signal wires are provided in an arced first corner in the bezel region. In an exemplary embodiment, a test circuit is a first test circuit, and a plurality of test units 80 included in the test circuit are first test units; each test unit 80 is respectively connected to a test control signal wire, a test data signal wire and a data signal wire in the display region, and the test unit 80 is configured to supply test data signals to a plurality of data signal wires in the display region. A gate driving circuit may include a plurality of cascaded shift register units 110, each of which is respectively connected to an initial signal wire, a clock signal wire and a scanning signal wire of the display region, and the shift register unit 110 is configured to supply a gate driving signal to at least one scanning signal wire of the display region. In an exemplary embodiment, the circuit structure of the second corner of the bezel region and the circuit structure of the first corner region may be the same.

In an exemplary embodiment, the signal wire of the first corner 211 is stepped wired, and the test unit 80 and the shift register unit 110 are respectively disposed on different steps. The signal wire includes a first wiring, a second wiring and a third wiring; the third wiring is located between the display region and the second wiring, and the second wiring is located between the first wiring and the third wiring; the first wirings and the second wirings forma plurality of first rectangles, and the shift register units 110 are respectively located in the first rectangles; the second wirings and the third wirings form a plurality of second rectangles, and the test units 80 are respectively located in the second rectangles.

In an exemplary embodiment, a first wiring may include a gate signal wire 121 stepped wired, a second wiring may include a test signal wire 122 stepped wired, and a third wiring may include a power signal wire 123 stepped wired; a minimum distance between the power signal wire 123 and the edge of a display region is smaller than that between the test signal wire 122 and the edge of a display region, and a minimum distance between the test signal wire 122 and the edge of a display region is smaller than that between the gate signal wire 121 and the edge of a display region. The stepped wired gate signal wires 121 and the stepped wired test signal wire 122 form a plurality of first rectangles, in which a plurality of shift register units 110 are respectively disposed in a stepped manner, that is, the plurality of shift register units 110 are respectively disposed on a plurality of steps formed by the test signal wires 122. The stepped wired test signal wires 122 and the stepped wired power supply signal wire 123 form a plurality of second rectangles, in which a plurality of test units 80 are respectively disposed in a stepped manner, that is, the plurality of test units 110 are respectively disposed on a plurality of steps formed by the power supply signal wires 123.

In an exemplary embodiment, a second rectangle is a rectangle with long sides in the first direction X and short sides in the second direction Y, that is, the extending direction of the long sides of the second rectangle is parallel to the first direction X.

In an exemplary embodiment, the gate signal wire 121, the test signal wire 122, and the power signal wire 123 each may include a plurality of first horizontal wire groups and a plurality of first vertical wire groups which are sequentially disposed along the edge of the display region in the second direction Y. The first horizontal wire group includes a plurality of first horizontal wires extending in a direction opposite to the first direction X, the first vertical wire group includes a plurality of first vertical wires extending in the second direction Y, the first horizontal wire group and the first vertical wire group are alternately disposed; a plurality of first horizontal wires in the first horizontal wire group and a plurality of first vertical wires in the first vertical wire group are sequentially connected to form a stepped wired. In an exemplary embodiment, a transition wire group may be provided between the first horizontal wire group and the first vertical wire group.

In an exemplary embodiment, at least two shift register units may be provided in a same first rectangle of a first corner 211.

In an exemplary embodiment, a first test unit may be provided in a same second rectangle of a first corner 211.

In an exemplary embodiment, the gate signal wire 121 may include one initial signal wire and four clock signal wires, the test signal wire 122 may include one test control signal wire and three test data signal wires, and the power signal wire 123 may include a second power supply line VDD and an initial signal wire INIT.

In an exemplary embodiment, a side of the gate signal wire 121 away from the display region may be provided with a first power supply line VSS configured to provide a low-level signal to the pixel driving circuit in each sub-pixel of the display region.

In an exemplary embodiment, at least one compensation capacitor 120 may be further provided between the power signal wire 123 and the display region, and the compensation capacitor 120 may include a plurality of sub-capacitors, the compensation capacitor 120 is configured to provide capacitance compensation for pixel driving circuits in the sub-pixels of the column where the compensation capacitor is located. In an exemplary embodiment, the compensation capacitor 120 includes a first plate and a second plate, wherein the first plate is connected to the second power line VDD through a power connecting wire, and the second plate of the compensation capacitor 120 is connected to a data signal wire. In an exemplary embodiment, one end of the second plate of the compensation capacitor 120 adjacent to the test unit 80 is connected to the test data signal wire, and the other end adjacent to the display region is connected to the data signal wire of the display region, that is, the test data signal wire of the test circuit is connected to the data signal wire of the display region through the second plate of the compensation capacitor.

In an exemplary embodiment, the test signal wire 122 (second wiring) includes a test control signal wire stepped wired and a test data signal wire stepped wired, and a minimum distance between the test data signal wire and the edge of the display region is smaller than a minimum distance between the test control signal wire and the edge of the display region. In an exemplary embodiment, at least one third rectangle may be formed between the stepped wired test control signal wire and the stepped wired test data signal wire, and a dummy unit 130 is provided in the at least one third rectangle. In an exemplary embodiment, a dummy unit may include a plurality of transistors, which may have a same structure as that of the transistors in the shift register unit, yet the transistors in a dummy unit are not electrically connected to the transistors in the shift register unit, and thus improving etching uniformity and manufacturing quality. In an exemplary embodiment, a third rectangle is a rectangle with long sides in the first direction X and short sides in the second direction Y, that is, the extending direction of the long sides of the third rectangle is parallel to the first direction X.

In a rectangular display substrate with rounded chamfers, an upper bezel (a third bezel) is wide with sufficient space, and a left bezel (a first bezel) and a right bezel (a second bezel) are narrow. Since the bezels at the corners are gradually connected by the narrower left bezel and the wider upper bezel (or the narrower right bezel and the wider upper bezel), the corners adjacent to the left bezel (or the right bezel) are bottlenecks to reduce the size of the bezel at the corners. According to the exemplary embodiment of the present disclosure, the signal wires in the first corner and the second corner are disposed in a stepped wired manner, so that a plurality of first rectangles are formed between the stepped wired gate signal wire and the stepped wired test signal wire, a plurality of second rectangles are formed between the stepped wired test signal wire and the stepped wired power signal wire; a plurality of shift register units are disposed in a stepped manner in the plurality of first rectangles, a plurality of test units are disposed in a stepped manner in the plurality of second rectangles, and the test units and the shift register units are respectively disposed on different steps. In this way, the corner space is effectively utilized to the maximum extent, the space required by the circuit can be met only by a small chamfer radius, the width of a rounded corner region is effectively reduced, a narrow bezel is achieved, the screen-to-body ratio is improved, and the overall screen display is facilitated.

In an exemplary embodiment, since the three test transistors in a first test unit are disposed at intervals along a first direction X and are flush in a second direction Y, the first test unit has a small height. In the design where a plurality of first test units are provided in a stepped wired manner in the first corner 211, the small height of the first test unit reduces not only the space occupied by the first test unit in the second direction Y but also the space occupied by the stepped wired arrangement in the first direction X, the corner space is effectively utilized to the maximum extent, only a small chamfer radius can meet the space requirement of the circuit, and the width of the corner area is effectively reduced.

In an exemplary embodiment, a plurality of second test units are disposed side by side in a third bezel 203, that is, a plurality of second test units in the third bezel 203 are sequentially disposed along a first direction X and are flush in a second direction Y. Since three test transistors in s second test unit are sequentially disposed along the second direction Y and are staggered in the first direction X, the shape of the second test unit has the characteristics of small width and large height. In the design of providing a plurality of second test units in the third bezel (upper bezel) 203, on the premise of ensuring that the third bezel 203 can be placed with the required quantity of second test units, the height of the second test units can be reduced as much as possible by increasing the width of the second test units, which maximally reduces the width of the upper bezel, and thus achieving a narrow bezel, increasing the screen-to-body ratio for achieving full screen display.

In a display substrate, a test signal wire may include four signal wires, namely one test control signal wire and three test data signal wires; four signal wires are disposed in an upper bezel (third bezel), a left bezel (first bezel) and a right bezel (second bezel), wherein the four signal wires in the left bezel and the right bezel extend along a second direction Y and are introduced into the binding pins in the lower bezel (fourth bezel), so the upper, left and right bezel of the display substrate are all provided with four signal wires. In an exemplary embodiment of the present disclosure, four signal wires are disposed in an upper bezel, a first corner and a second corner respectively, only two signal wires are disposed in a left bezel, and the two signal wires extend along a second direction Y and lead to binding pins in a lower bezel, and only two signal wires are disposed in a right bezel, and the two signal wires extend along a second direction Y and lead to binding pins in a lower bezel. In an exemplary embodiment, two test data signal wires may be provided in the left bezel and one test control signal wire and one test data signal wire may be provided in the right bezel, or, one test control signal wire and one test data signal wire may be provided in the left bezel and two test data signal wires may be provided in the right bezel; the present disclosure is not limited here. By respectively providing two signal wires in the left bezel and the right bezel, the width of the left bezel and the right bezel can be reduced for achieving the narrow bezel.

Figure 22:
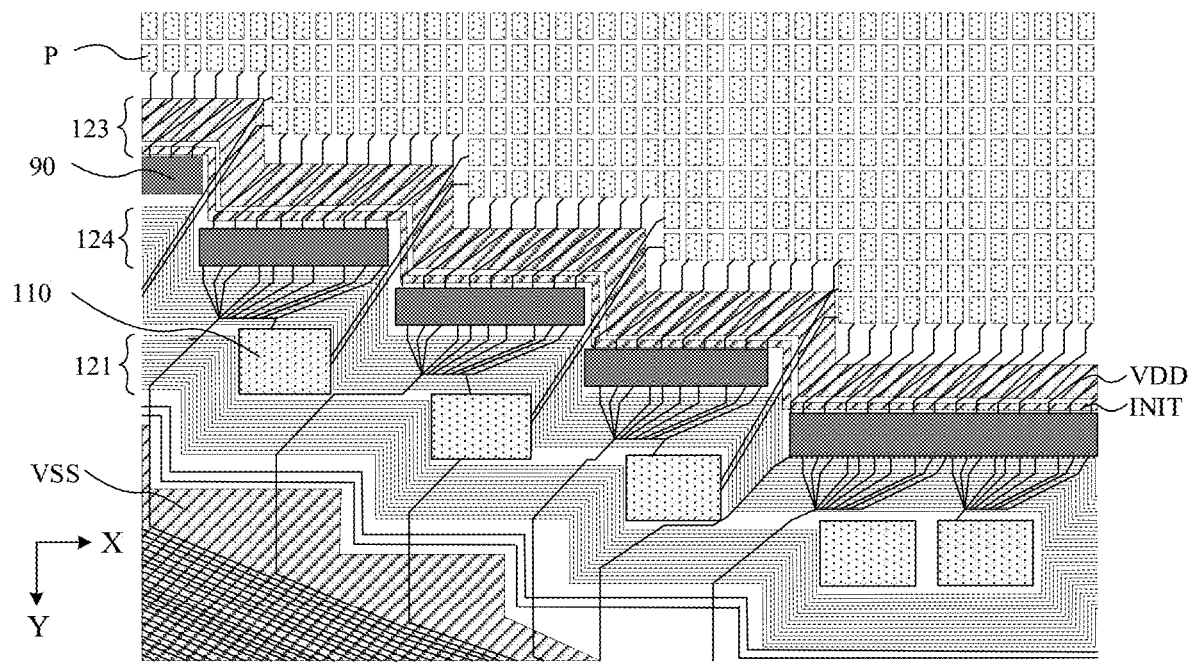
FIG. 22 is a layout of a structure of a multiplexing unit according to an exemplary embodiment of the present disclosure.

FIG. 22 is a layout of a structure of a multiplexing unit according to an exemplary embodiment of the present disclosure. As shown in FIG. 22, in an exemplary embodiment, a display substrate of a rectangular shape with rounded chamfers includes a display region and a bezel region, wherein the display region includes a plurality of sub-pixels P disposed in a matrix manner, and a multiplexing circuit (MUX), a gate drive circuit (gate driver on array, GOA, for example) and corresponding signal wires are provided in a third corner 213 in the bezel region. In an exemplary embodiment, multiplexing circuit may include a plurality of multiplexing units 90, each of which is connected to a plurality of data signal wires of the display region and configured so that a signal source can supply data signals to a plurality of data signal wires. A gate driving circuit may include a plurality of cascaded shift register units 110, each of which is connected to at least one scanning signal wire of a display region and configured to provide a gate driving signal to at least one scanning signal wire of the display region. In an exemplary embodiment, the circuit structure of the fourth corner and the circuit structure of the third corner region of the bezel region may be the same.

In an exemplary embodiment, a signal wire of a third corner 213 is stepped wired, and the multiplexing unit 90 and the shift register unit 110 are respectively disposed on different steps. The signal wire includes a first wiring, a second wiring and a third wiring; the third wiring is located between the display region and the second wiring, and the second wiring is located between the first wiring and the third wiring; the first wirings and the second wirings form a plurality of first rectangles, and the plurality of shift register units 110 are respectively located in the first rectangles; the second wirings and the third wirings form a plurality of second rectangles, and the plurality of multiplexing units 90 are respectively located in the second rectangles.

In an exemplary embodiment, a second rectangle is a rectangle with long sides in the first direction X and short sides in the second direction Y, that is, the extending direction of the long sides of the second rectangle is parallel to the first direction X.

In an exemplary embodiment, a first wiring may include a gate signal wire 121 stepped wired, a second wiring may include a multiplexing signal wire 124 stepped wired, and a third wiring may include a power signal wire 123 stepped wired; a distance between the power signal wire 123 and the edge of a display region is smaller than that between the multiplexing signal wire 124 and the edge of a display region, and a distance between the multiplexing signal wire 124 and the edge of a display region is smaller than that between the gate signal wire 121 and the edge of a display region. The stepped wired gate signal wires 121 and the stepped wired multiplexing signal wire 124 form a plurality of first rectangles, in which a plurality of shift register units 110 are respectively disposed in a stepped manner, that is, the plurality of shift register units 110 are respectively disposed on a plurality of steps formed by the gate signal wire 121. The stepped wired multiplexing signal wires 124 and the stepped wired power supply signal wire 123 form a plurality of second rectangles, in which a plurality of multiplexing units 90 are disposed in a stepped manner, that is, the a plurality of shift register units 110 are respectively disposed on a plurality of steps formed by the multiplexing signal wire 124.

In an exemplary embodiment, the gate signal wire 121, the multiplexing signal wire 124, and the power signal wire 123 each may include a plurality of second horizontal wire groups and a plurality of second vertical wire groups which are sequentially disposed along the edge of the display region in the second direction Y. The second horizontal wire group includes a plurality of first horizontal wires extending in the first direction X, the first vertical wire group includes a plurality of second vertical wires extending in the second direction Y, the second horizontal wire group and the second vertical wire group are alternately disposed; a plurality of second horizontal wires in the second horizontal wire group and a plurality of second vertical wires in the second vertical wire group are sequentially connected to form a stepped wired. In an exemplary embodiment, a transition line group may be disposed between the second insulating layer and the third insulating layer.

In an exemplary embodiment, at least one shift register units may be provided in a same first rectangle of a third corner 213.

In an exemplary embodiment, a multiplexing unit may be provided in a same second rectangle of a third corner 213.

In an exemplary embodiment, the gate signal wire 121 may include one initial signal wire and four clock signal wires, the multiplexing signal wire 124 may include three multiplexing control signal wires and one multiplexing data signal wire, and the power signal wire 123 may include a second power supply line VDD and an initial signal wire INIT, and a first power supply line VSS may be further provided on a side of the gate signal wire 121 away from the display region.

In a display substrate, signal wires in a third corner and a fourth corner are in an arced wiring mode, multiplexing units and shift register units are sequentially disposed along the arced wiring, and the multiplexing units and the shift register units are alternately disposed between the arced wiring. Research finds that in this arrangement of multiplexing units and shift register units, a larger chamfer radius is needed to meet the space requirement of the circuit, which makes the bezel narrowing in the lower rounded corner region become the bottleneck of design. According to the exemplary embodiment of the present disclosure, the signal wires in the third corner and the fourth corner are disposed in a stepped wiring manner, so that a plurality of first rectangles are formed between the stepped wired gate signal wire and the stepped wired multiplexing signal wire, a plurality of second rectangles are formed between the stepped wired multiplexing signal wire and the stepped wired power signal wire; a plurality of shift register units are disposed in a stepped manner in the plurality of first rectangles, a plurality of multiplexing units are disposed in a stepped manner in the a plurality of second rectangles, and the multiplexing units and the shift register units are respectively disposed on different steps. In this way, the corner space is effectively utilized to the maximum extent, the space required by the circuit can be met only by a small chamfer radius, the width of a rounded corner region is effectively reduced, a narrow bezel is achieved, the screen-to-body ratio is improved, and the overall screen display is facilitated.

Figure 23:
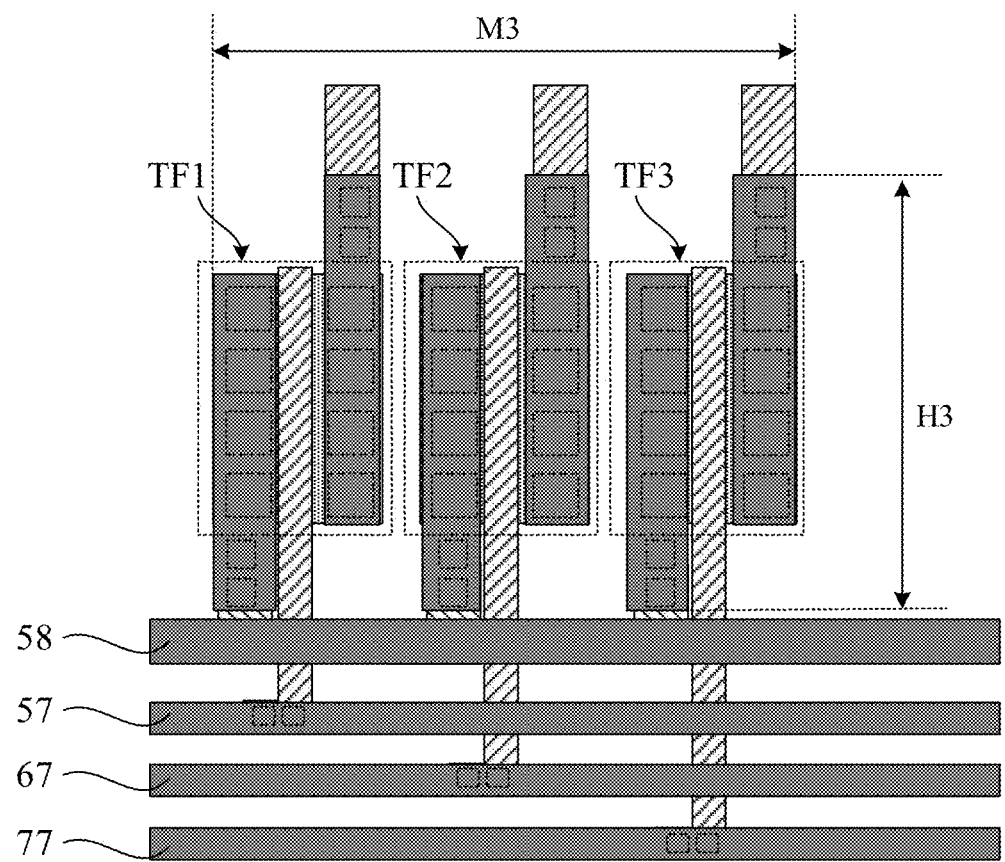
FIG. 23 is a schematic diagram of a structure of a multiplexing unit according to an exemplary embodiment of the present disclosure.

FIG. 23 is a schematic diagram of a structure of a multiplexing unit according to an exemplary embodiment of the present disclosure, showing a multiplexing unit including three multiplexing transistors. As shown in FIG. 23, in a direction parallel to the display substrate, a multiplexing unit includes three multiplexing transistors, which are sequentially disposed along a first direction X and are flush in a second direction Y. The multiplexing gate electrode (control electrode) of the first multiplexing transistor TF1 is connected to the first multiplexing control signal wire 57, the multiplexing gate electrode (control electrode) of the second multiplexing transistor TF2 is connected to the second multiplexing control signal wire 67, and the multiplexing gate electrode (control electrode) of the third multiplexing transistor TF1 is connected to the third multiplexing control signal wire 77. The multiplexing source electrode (first electrode) of the first multiplexing transistor TF1, the multiplexing source electrode (first electrode) of the second multiplexing transistor TF2 and the multiplexing source electrode (first electrode) of the third multiplexing transistor TF3 are all connected to the multiplexing data signal wire 58. The multiplexing drain electrode (second electrode) of the first multiplexing transistor is connected to one data signal wire in the display region, the multiplexing drain electrode (second electrode) of the second multiplexing transistor is connected to another data signal wire in the display region, and the multiplexing drain electrode (second electrode) of the third multiplexing transistor is connected to another data signal wire in the display region.

In an exemplary embodiment, a multiplexing unit may have a height smaller than that of a shift register unit.

In an exemplary embodiment, a shift register unit may have a height of about 1.5 times to 2 times that of a multiplexing unit.

In an exemplary embodiment, a multiplexing unit may be rectangular, and has a height (third height H3) of 0.5 to 0.9 times its width (third width M3).

In an exemplary embodiment, a multiplexing unit may have a height (third height H3) of about 35 μm to 45 μm and a width (third width M3) of about 48 μm to 70 μm, and a shift register unit may have height of about 68 μm to 70 μm.

In an exemplary embodiment, compared with a multiplexing unit alternately disposed in an arc, the height of the multiplexing unit according to the exemplary embodiment of the present disclosure can be reduced by 50% to 60%.

In an exemplary embodiment, a multiplexing unit may have a height of about 40 μm and a width (third width M3) of about 59 μm.

In a direction perpendicular to a display substrate, a multiplexing unit may include:
a first insulating layer disposed on a substrate;
A plurality of multiplexing active layers disposed on the first insulating layer, wherein the plurality of multiplexing active layers are disposed at intervals along a first direction and are flush in a second direction;
  a second insulating layer covering the plurality of multiplexing active layers, and a plurality of multiplexing gate electrodes and a plurality of multiplexing data wires disposed on the second insulating layer; wherein, the plurality of multiplexing gate electrodes are disposed at intervals along the first direction, the first terminals of the plurality of multiplexing gate electrodes adjacent to the display region are flush in the second direction, and the second ends of the plurality of multiplexing gate electrodes away from the display region have different distances from the edge of the display region; wherein the first ends of the plurality of multiplexing data wires are respectively located on a side of the plurality of multiplexing active layers adjacent to the display region, and the second ends of the a plurality of multiplexing data wire extend along a direction towards the display region;
  a third insulating layer covering the plurality of multiplexing gate electrodes and the plurality of multiplexing data wires, and a plurality of multiplexing connecting wires disposed on the third insulating layer, wherein the multiplexing connecting wires are disposed at intervals along the first direction, first ends of the multiplexing connecting wires are respectively located on one side of the plurality of test active layers away from the display region, and second ends of the multiplexing connecting wires extend in a direction away from the display region;
  a fourth insulating layer covering the plurality of multiplexing connecting wires, on which a plurality of vias are provided;
  a plurality of multiplexing source electrodes and a plurality of multiplexing drain electrodes disposed on the fourth insulating layer; the multiplexing source electrodes are respectively connected to the corresponding multiplexing active layers and the first ends of the corresponding multiplexing connecting wires through vias, and the second ends of the multiplexing connecting wires are connected to the multiplexing data signal wires through vias; the multiplexing drain electrodes are respectively connected to the first ends of corresponding multiplexing active layers and corresponding multiplexing data wires through vias, and the second ends of the multiplexing data wires are connected to data signal wires of the display region; and the second ends of the multiplexing gate electrodes are connected to corresponding multiplexing control signal wires through vias.

In an exemplary embodiment, the manufacturing process of a multiplexing unit may include the following operations.

Figure 24:
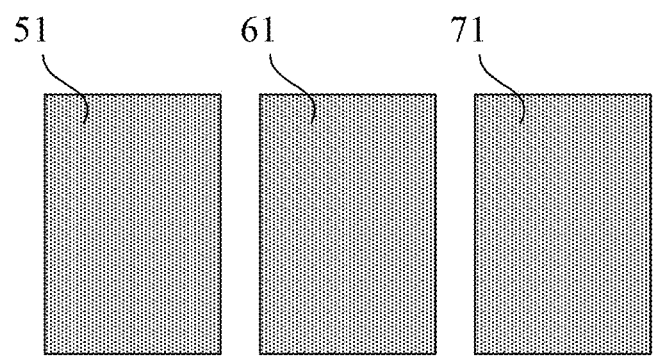
FIG. 24 to FIG. 28 are schematic diagrams of the manufacturing of a multiplexing unit according to exemplary embodiments of the present disclosure.

(21) Forming a pattern of a semiconductor layer on a substrate. In an exemplary embodiment, forming a pattern of a semiconductor layer on a substrate may include: sequentially depositing a first insulating film and a semiconductor film on the substrate, and patterning the semiconductor film through a patterning process to form a first insulating layer covering the entire substrate and a pattern of a semiconductor layer disposed on the first insulating layer; the pattern of a semiconductor layer includes at least a first multiplexing active layer 51, a second multiplexing active layer 61, and a third multiplexing active layer 71, as shown in FIG. 24. In an exemplary embodiment, three multiplexing active layers are disposed at intervals along a first direction X and are flush in a second direction Y, so that the size of the multiplexing circuit in the second direction Y can be effectively reduced. In an exemplary embodiment, the width of the three multiplexing active layers in the first direction X may be about 14 μm to 21 μm, and the height in the second direction Y may be about 20 μm to 30 μm. In an exemplary embodiment, each test active layer may have a width of about 17.3 μm and a height of about 25 μm.

Figure 25:
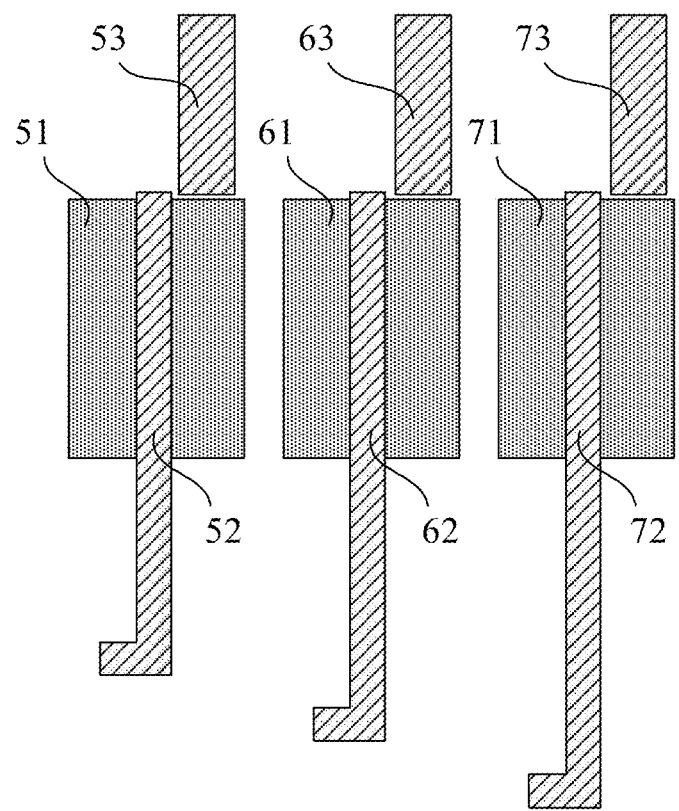

(22) Forming a pattern of a first metal layer. In an exemplary embodiment, forming a pattern of a first metal layer may include: sequentially depositing a second insulating film and a first metal film on the substrate on which the aforementioned patterns are formed, and patterning the first metal film through a patterning process to form a second insulating layer covering the pattern of the semiconductor layer and a pattern of the first metal layer disposed on the second insulating layer; the pattern the first metal layer includes at least a first multiplexing gate electrode 52, a second multiplexing gate electrode 62, a third multiplexing gate electrode 72, a first multiplexing data wire 53, a second multiplexing data wire 63 and a third multiplexing data wire 73, as shown in FIG. 25. In an exemplary embodiment, three multiplexing gate electrodes are disposed at intervals along a first direction X, and first ends of the three multiplexing gate electrodes adjacent to the display region are flush in a second direction Y, so that the size of the multiplexing circuit in the second direction Y can be effectively reduced. The second ends of the three multiplexing gate electrodes away from the display region have different distances from the edge of the display region, and are configured to be connected to multiplexing control signal wires formed subsequently. In an exemplary embodiment, three multiplexing data wires are disposed at intervals along a first direction X, first ends of the three multiplexing data wires are respectively located on one side of the three multiplexing active layers adjacent to the display region, and second ends of the three multiplexing data wires extend toward the display region and are configured to be respectively connected to data signal wires of the display region. In an exemplary embodiment, the three test gate electrodes may have widths of about 5 μm to 7 μm in a first direction X. In an exemplary embodiment, each test gate electrode may have a width about 6 μm.

Figure 26:
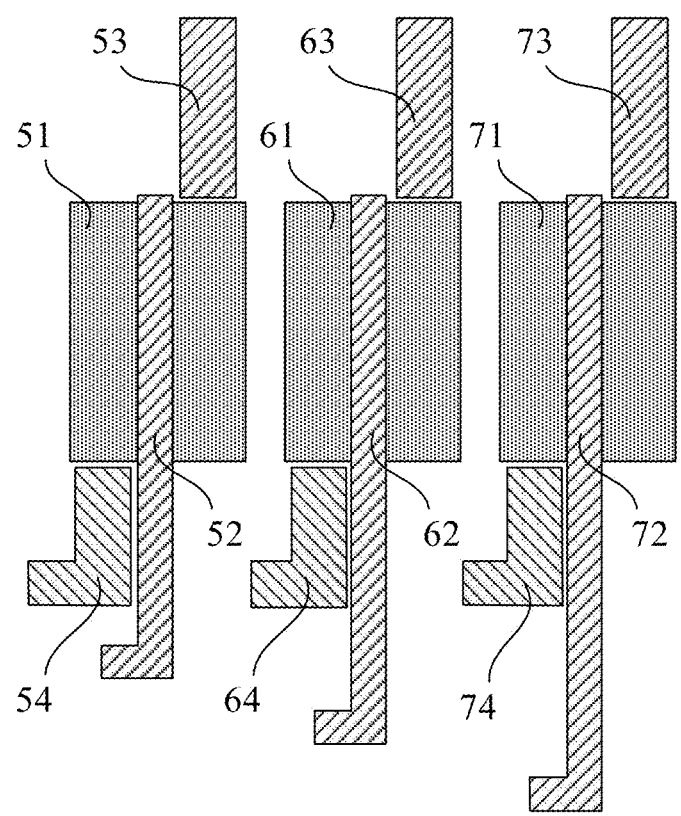

(23) Forming a pattern of a second metal layer. In an exemplary embodiment, forming a pattern of a second metal layer may include: sequentially depositing a third insulating film and a second metal film on the substrate on which the aforementioned patterns are formed, and patterning the second metal film through a patterning process to form a third insulating layer covering the pattern of the first metal layer, and a pattern of the second metal layer disposed on the third insulating layer, the second metal layer pattern includes at least a first multiplexing connecting wire 54, a second multiplexing connecting wire 64, and a third multiplexing connecting wire 74, as shown in FIG. 26. In an exemplary embodiment, three multiplexing connecting wires are disposed at intervals along a first direction X, first ends of the three multiplexing connecting wires are respectively located on one side of the a plurality of test active layers away from the display region, and second ends of the three multiplexing connecting wires extend toward a direction away from the display region and are configured to be simultaneously connected to multiplexing data signal wires formed subsequently.

Figure 27:
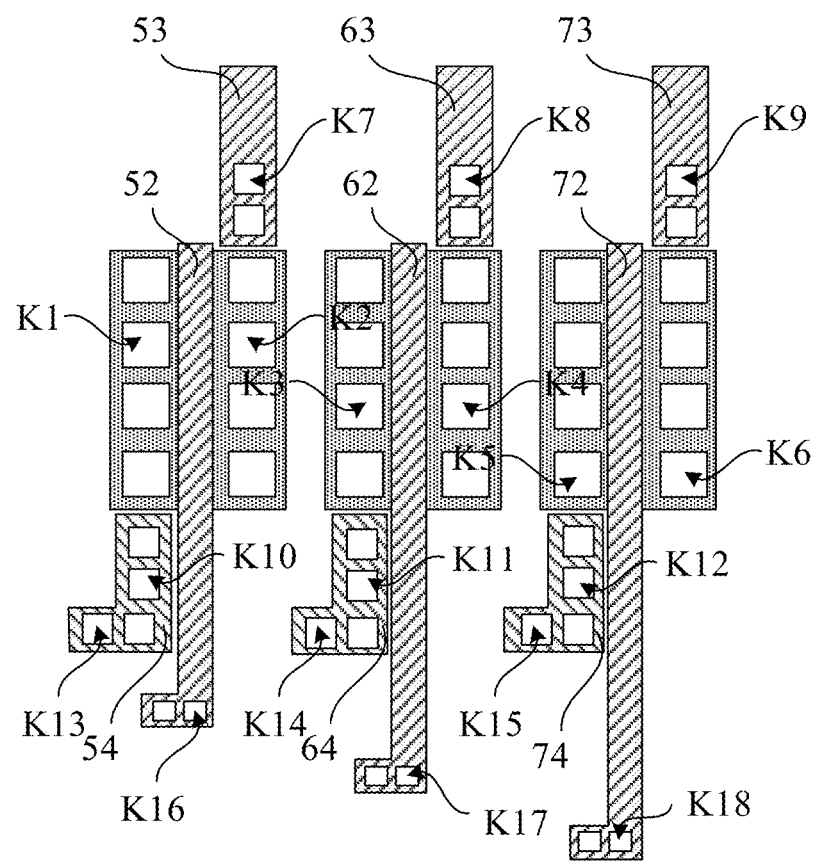

(24) Forming a pattern of a fourth insulating layer. In an exemplary embodiment, forming a pattern of a fourth insulating layer may include: depositing a fourth insulating film on the substrate on which the aforementioned patterns are formed, and patterning the fourth insulating film through a patterning process to form a fourth insulating layer covering the pattern of the second metal layer, and a plurality of vias are provided on the fourth insulating layer, as shown in FIG. 27. In an exemplary embodiment, the plurality of vias on the fourth insulating layer may include: a plurality of first multiplexing vias K1 located on a side of the first multiplexing gate electrode 52 adjacent to the first multiplexing connecting wire 54 and exposing the first multiplexing active layer 51, a plurality of second multiplexing vias K2 located on a side of the first multiplexing gate electrode 52 adjacent to the first multiplexing data wire 53 and exposing the first multiplexing active layer 51, a plurality of third multiplexing vias K3 located on a side of the second multiplexing gate electrode 62 adjacent to the second multiplexing connecting wire 64 and exposing the second multiplexing active layer 61, a plurality of fourth multiplexing via K4 located on a side of the second multiplexing gate electrode 62 adjacent to the second multiplexing data wire 63 and exposing the second multiplexing active layer 61, a plurality of fifth multiplexing via K5 located on a side of the third multiplexing gate electrode 72 adjacent to the third multiplexing connecting wire 74 and exposing the third multiplexing active layer 71, a plurality of sixth multiplexing via K6 located on a side of the third multiplexing gate electrode 72 adjacent to the third multiplexing data wire 73 and exposing the third multiplexing active layer 71, a seventh multiplexing via K7 located on a first end of the first multiplexing data wire 53 adjacent to the first multiplexing active layer 51 and exposing the first multiplexing data wire 53, an eighth multiplexing via K8 located on a first end of the second multiplexing data wire 63 adjacent to the second multiplexing active layer 61 and exposing the second multiplexing data wire 63, a ninth multiplexing via K9 located on a first end of the third multiplexing data wire 73 adjacent to the third multiplexing active layer 71 and exposing the third multiplexing data wire 73, a tenth multiplexing via K10 located on a first end of the first multiplexing connecting wire 54 adjacent to the first multiplexing active layer 51 and exposing the first multiplexing connecting wire 54, an eleventh multiplexing via K11 located on a first end of the second multiplexing connecting wire 64 adjacent to the second multiplexing active layer 61 and exposing the second multiplexing connecting wire 64, a twelfth multiplexing via K12 located on a first end of the third multiplexing connecting wire 74 adjacent to the third multiplexing active layer 71 and exposing the third multiplexing connecting wire 74, a thirteenth multiplexing via K13 located on a second end of the first multiplexing connecting wire 54 away from the first multiplexing active layer 51 and exposing the first multiplexing connecting wire 54, an fourteenth multiplexing via K14 located on a second end of the second multiplexing connecting wire 64 away from the second multiplexing active layer 61 and exposing the second multiplexing connecting wire 64, a fifteenth multiplexing via K15 located on a second end of the third multiplexing connecting wire 74 away from the third multiplexing active layer 71 and exposing the third multiplexing connecting wire 74, a sixteenth multiplexing via K16 located on a second end of the first multiplexing gate electrode 52 away from the first multiplexing active layer 51 and exposing the first multiplexing gate electrode 52, an seventeenth multiplexing via K17 located on a second end of the second multiplexing gate electrode 62 away from the second multiplexing active layer 61 and exposing the second multiplexing gate electrode 62, and an eighteenth multiplexing via K18 located on a second end of the third multiplexing gate electrode 72 away from the third multiplexing active layer 71 and exposing the third multiplexing gate electrode 72.

Figure 28:
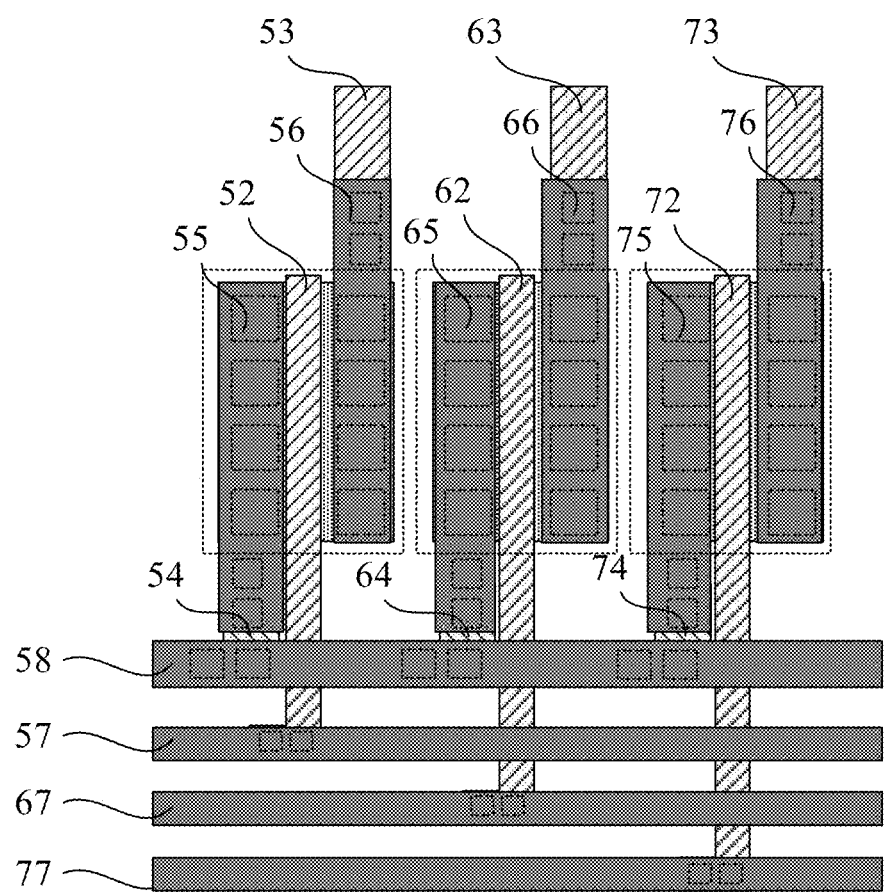

(25) Forming a pattern of a third metal layer. In an exemplary embodiment, forming a pattern of a third metal layer may include: depositing a third metal film on the substrate on which the aforementioned patterns are formed, patterning the third metal film through a patterning process, forming a pattern of the third metal layer on a fourth insulating layer, and the pattern of the third metal layer at least includes: a first multiplexing source electrode 55, a first multiplexing drain electrode 56, a second multiplexing source electrode 65, a second multiplexing drain electrode 66, a third multiplexing source electrode 75, a third multiplexing drain electrode 76, a first multiplexing control signal wire 57, a second multiplexing control signal wire 67, a first multiplexing control signal wire 77 and a multiplexing data signal wire 58, as shown in FIG. 28. In an exemplary embodiment, one terminal of a first multiplexing source electrode 55 is connected to a first multiplexing active layer 51 through a first multiplexing via K1, and the other terminal is connected to a first end of a first multiplexing connecting wire 54 through the tenth multiplexing via K10. One terminal of a first multiplexing drain electrode 56 is connected to the first multiplexing active layer 51 through a second multiplexing via K2, the other terminal is connected to a first end of a first multiplexing data wire 53 through the seventh multiplexing via K7, and the second end of the first multiplexing data wire 53 is connected to a data signal wire in the display region. One terminal of a second multiplexing source electrode 65 is connected to a second multiplexing active layer 61 through a third multiplexing via K3, and the other terminal is connected to a first end of a second multiplexing connecting wire 64 through the eleventh multiplexing via K11. One terminal of a second multiplexing drain electrode 66 is connected to a second multiplexing active layer 61 through a fourth multiplexing via K4, the other terminal is connected to a first end of a second multiplexing data wire 63 through the eighth multiplexing via K8, and the second end of the second multiplexing data wire 63 is connected to a data signal wire in the display region. One terminal of a third multiplexing source electrode 75 is connected to a third multiplexing active layer 71 through a fifth multiplexing via K5, and the other terminal is connected to a first end of a third multiplexing connecting wire 74 through the twelfth multiplexing via K12. One terminal of a third multiplexing drain electrode 76 is connected to the third multiplexing active layer 71 through a sixth multiplexing via K6, the other terminal is connected to a first end of a third multiplexing data wire 73 through the ninth multiplexing via K9, and the second end of the third multiplexing data wire 73 is connected to a data signal wire in the display region. A first multiplexing control signal wire 57 is connected to a second terminal of a first multiplexing gate electrode 52 through the sixteenth multiplexing via K16, a second multiplexing control signal wire 67 is connected to a second terminal of a second multiplexing gate electrode 62 through the seventeenth multiplexing via K17, and a third multiplexing control signal wire 77 is connected to a second terminal of a third multiplexing gate electrode 72 through the eighteenth multiplexing via K18. A multiplexing data signal wire 58 is connected to a second end of a first multiplexing connecting wire 54, a second end of the second multiplexing connecting wire 64 and a second end of a third multiplexing connecting wire 74 through the thirteenth multiplexing via K13, the fourteenth multiplexing via K14 and the fifteenth multiplexing via K15, respectively.

In an exemplary embodiment, a distance between a side edge of a first multiplexing source electrode away from a first multiplexing active layer and a side edge of a first multiplexing drain electrode away from the first multiplexing active layer may be about 14 μm to 21 μm, a distance between a side edge of a second multiplexing source electrode away from a second multiplexing active layer and a side edge of a second multiplexing drain electrode away from the second multiplexing active layer may be about 14 μm to 21 μm, a distance between a side edge of a third multiplexing source electrode away from a third multiplexing active layer and a side edge of a third multiplexing drain electrode away from the third multiplexing active layer may be about 14 μm to 21 μm. In an exemplary embodiment, a distance between a side edge of each multiplexing source electrode and a side edge of a multiplexing drain electrode may be about 17.3 μm.

In an exemplary embodiment, a first multiplexing active layer 51, a first multiplexing gate electrode 52, a first multiplexing source electrode 55 and a first multiplexing drain electrode 56 form the first multiplexing transistor TF1; a second multiplexing active layer 61, a second multiplexing gate electrode 62, a second multiplexing source electrode 65 and a second multiplexing drain electrode 66 form the second multiplexing transistor TF2; a third multiplexing active layer 71, a first multiplexing gate electrode 72, a third multiplexing source electrode 75, and a third multiplexing drain electrode 76 form a third multiplexing transistor TF3; and the first multiplexing transistor TF1, the second multiplexing transistor TF2 and the third multiplexing transistor TF3 form a test unit. The first multiplexing gate electrode 52 is connected to a first multiplexing control signal wire 57, the second multiplexing gate electrode 62 is connected to a second multiplexing control signal wire 67, and the third multiplexing gate electrode 72 is connected to third multiplexing control signal wire 77; the first multiplexing source electrode 55, the second multiplexing source electrode 65, and the third multiplexing source electrode 75 are connected to a same multiplexing data signal wire 58 through a first multiplexing connecting wire 54, a second multiplexing connecting wire 64, and a third multiplexing connecting wire 74, respectively; the first multiplexing drain electrode 56, the second multiplexing drain electrode 66, and the third multiplexing drain electrode 76 are connected to different data signal wires in the display region through a first multiplexing data wire 53, a second multiplexed data wire 63, and a third multiplexing data wire 73, respectively. During display, a control device supplies the conduction signal to the first multiplexing control signal wire 57, the second multiplexing control signal wire 67 and the third multiplexing control signal wire 77 in a time division manner, so that the first multiplexing transistor TF1, the second multiplexing transistor TF2 and the third multiplexing transistor TF3 are turned on at different time; when any one of the multiplexing transistors is turned on, the multiplexing data signal wire 58 supplies the data signal required by a data signal wire connected to the conducted multiplexing transistor to write the data signal into the corresponding sub-pixel.

An exemplary embodiment of the present disclosure provides a multiplexing circuit structure, in which a plurality of multiplexing transistors are sequentially disposed along a first direction and are flush in a second direction, so that the height of multiplexing units is effectively reduced without changing the size of thin film transistors. Combined with the stepped wired signal wires in a third corner and a fourth corner, the multiplexing units are disposed along a multiplexing signal wire in a stepped manner, the shift register units are disposed long a gate signal wires in a stepped manner, and the multiplexing units and the shift register units are respectively disposed on different steps. In this way, the corner space is effectively utilized to the maximum extent, the space required by the circuit can be met only by a small chamfer radius, the width of a lower bezel and a lower rounded corner region is effectively reduced, a narrow bezel is achieved, the screen-to-body ratio is improved, and the overall screen display is facilitated.

The structure of the multiplexing unit shown in the present disclosure and the preparation process thereof are merely an exemplary description. In an exemplary implementation, corresponding structures may be changed and patterning processes may be added or reduced according to actual needs. For example, a multiplexing connecting wire may be disposed in a first metal layer and a multiplexing data wire may be disposed in a second metal layer. For another example, a multiplexing gate electrode, a multiplexing connecting wire and a multiplexing data wire may be disposed on a same layer and formed through a same patterning process. For another example, other electrodes, leads, and film layers may be disposed in the multiplexing unit, and the present application is not limited thereto.

In an exemplary embodiment, the aforementioned test unit and multiplexing unit may be simultaneously formed by a same manufacturing process. A semiconductor layer pattern of the test unit and a semiconductor layer pattern of the multiplexing unit are disposed in a same layer and formed by a same patterning process, a first metal layer pattern of the test unit and a first metal layer pattern of the multiplexing unit are disposed in a same layer and formed by a same patterning process, a second metal layer pattern of the test unit and a second metal layer pattern of the multiplexing unit are disposed in a same layer and formed by a same patterning process, a fourth insulating layer via pattern of the test unit and a fourth insulating layer via pattern of the multiplexing unit are disposed in a same layer and formed by a same patterning process, a third metal layer pattern of the test unit and a third metal layer pattern of the multiplexing unit are disposed in a same layer and formed by a same patterning process, the present disclosure are not limited here.

In an exemplary embodiment, the test unit and the multiplexing unit of the bezel region can be simultaneously formed as the pixel driving circuit of the display region in the same manufacturing process. For example, semiconductor layer patterns of the test units and multiplexing units may be disposed on a same layer as an active layer of the thin film transistor in the pixel driving circuit and formed by a same patterning process, first metal layer patterns of the test unit and the multiplexing unit may be disposed in a same layer as the gate electrode of the thin film transistor in the pixel driving circuit and formed by a same patterning process, second metal layer patterns of the test unit and the multiplexing unit may be disposed on a same layer as the second capacitor plate of the thin film transistor in the pixel driving circuit and formed by a same patterning process, third metal layer patterns of the test unit and the multiplexing unit may be disposed in a same layer as the source electrode and drain electrode of the thin film transistor in the pixel driving circuit and formed by a same patterning process, the present disclosure are not limited here.

In an exemplary embodiment, the first insulation layer, the second insulation layer, the third insulation layer and the fourth insulation layer can be made of any one or more of silicon oxide (SiOx), silicon nitride (SiNx) and silicon oxynitride (SiON), and can be a single layer, a plurality of layers or a composite layer. The first insulating layer may be referred to as a buffer layer, which is used to improve the water and oxygen resistance capability of the substrate. The second insulating layer and the third insulating layer may be referred to as gate insulating (GI) layers. The fourth insulating layer may be referred to as an interlayer insulating (ILD) layer. The first metal thin film, the second metal thin film and the third metal thin film may be made of metal materials, such as any one or more of silver (Ag), copper (Cu), aluminum (Al), titanium (Ti) and molybdenum (Mo), or alloy materials of the above metals, such as aluminum neodymium alloy (AlNd) or molybdenum niobium alloy (MoNb), and may have a single-layer structure or a multi-layer composite structure, such as Ti/Al/Ti. The active layer thin film may be made of materials such as amorphous indium gallium zinc oxide (a-IGZO), zinc oxynitride (ZnON), indium zinc tin oxide (IZTO), amorphous silicon (a-Si), polysilicon (p-Si), hexathiophene, or polythiophene, etc. That is, the present disclosure is applicable to transistors that are manufactured based on oxide technology, silicon technology or organic technology. The active layer based on the oxide technology may be made of: an oxide that includes indium and tin; an oxide that includes tungsten and indium; an oxide that includes tungsten, indium and zinc; an oxide that includes titanium and indium; an oxide that includes titanium, indium and tin; an oxide that includes indium and zinc; an oxide that includes silicon, indium and tin; or an oxide that includes indium, gallium and zinc, etc.

An exemplary embodiment of the present disclosure further provides a method for manufacturing a display substrate. The display substrate includes a display region and a bezel region on the periphery of the display region; the bezel region includes a first bezel and a second bezel oppositely disposed in the first direction, a third and a fourth bezel oppositely disposed in the second direction, a first corner connecting a first bezel and a third bezel, a second corner connecting a second bezel and a third bezel, a third corner connecting a first and a fourth bezel, and a fourth corner connecting a second bezel and a fourth bezel; at least one of the first to the fourth corner is an arced corner; the first direction is an extending direction of a scanning signal wire in the display region, and the second direction is an extending direction of a data signal wire in the display region; and the manufacturing method includes:

forming a display structure in the display region, and forming a first wiring, a second wiring and a plurality of shift register units in at least one of the first to the fourth corner; wherein, a plurality of first rectangles are formed between the first wiring and the second wiring, and a plurality of shift register units are respectively disposed in the first rectangles.

In an exemplary embodiment, at least one of the first to the fourth corner is further provided with a third wiring, which is disposed between the display region and the second wiring, and a plurality of second rectangles are formed between a third wiring and a second wiring.

An exemplary embodiment of the present disclosure further provides a display apparatus which includes any display substrate of the aforementioned embodiments. The display apparatus may be any product or component with a display function such as a mobile phone, a tablet computer, a television, a monitor, a laptop, a digital frame, or a navigator, etc. In an exemplary embodiment, the display apparatus may be a wearable display apparatus, which can be worn on a human body in some ways, such as a smart watch, a smart wristband, and the like.

The drawings in the present disclosure only refer to the structures involved in the present disclosure, and common designs may be referred to for other structures. The embodiments of the present disclosure, i.e., the features in the embodiments may be combined with each other to obtain a new embodiment if there is no conflict.

Those of ordinary skills in the art should understand that modifications or equivalent substitutions may be made to the technical solutions of the present disclosure without departing from the spirit and scope of the technical solutions of the present disclosure, all of which should be included within the scope of the claims of the present disclosure.

What is claimed is:

1. A display substrate, comprising:
a display region and a bezel region located on a periphery of the display region, wherein the bezel region comprises a first bezel and a second bezel oppositely disposed in a first direction, a third bezel and a fourth bezel oppositely disposed in a second direction, a first corner connecting a first bezel and a third bezel, a second corner connecting a second bezel and a third bezel, a third corner connecting a first bezel and a fourth bezel, and a fourth corner connecting a second bezel and a fourth bezel; at least one of the first corner to the fourth corner is an arced corner; the first direction is an extending direction of scanning signal wires in the display region, and the second direction is an extending direction of data signal wires in the display region; at least one of the first corner to the fourth corner is provided with a stepped first wiring and a plurality of stepped second wirings, the stepped first wiring comprises a first wiring segment extending along the first direction and a first wiring segment extending along the second direction, each of the plurality of stepped second wirings comprises a second wiring segment extending along the first direction and a second wiring segment extending along the second direction, a plurality of first rectangle regions are formed by the first wiring segment extending along the first direction, the first wiring segment extending along the second direction, the second wiring segment extending along the first direction and the second wiring segment extending along the second direction which are adjacent, and a plurality of shift register units are respectively disposed in the plurality of first rectangle regions,
wherein the plurality of stepped second wirings are a plurality of stepped test signal wires, at least one third rectangle region is formed between one of the plurality of stepped test signal wires and the rest of the plurality of stepped test signal wires, and a dummy unit is disposed in the at least one third rectangle region.

2. The display substrate according to claim 1, wherein at least one of the first corner to the fourth corner is further provided with a stepped third wiring, which is disposed between the display region and the plurality of stepped second wirings, the stepped third wiring comprises a third wiring segment extending along the first direction and a third wiring segment extending along the second direction, and a plurality of second rectangle regions are formed by the second wiring segment extending along the first direction, the second wiring segment extending along the second direction, the third wiring segment extending along the first direction and the third wiring segment extending along the second direction which are adjacent.

3. The display substrate according to claim 2, wherein at least one second rectangle region of the plurality of second rectangle regions has long sides and short sides, and an extending direction of the long sides of the second rectangle region is parallel to the first direction.

4. The display substrate according to claim 2, wherein at least one of the first corner and the second corner is provided with a plurality of first test units, and the first test units are respectively disposed in the plurality of second rectangle regions.

5. The display substrate according to claim 4, wherein at least one first test unit is disposed in a same second rectangle region in at least one of the first corner and the second corner;
or
at least two shift register units are disposed in a same first rectangle region in at least one of the first corner and the second corner.

6. The display substrate according to claim 4, wherein the stepped first wiring comprises a gate signal wire stepped wired, and the stepped third wiring comprises a power signal wire stepped wired; a minimum distance between the power signal wire and an edge of the display region is smaller than that between the test signal wires and the edge of the display region, and a minimum distance between the test signal wires and the edge of the display region is smaller than that between the gate signal wire and the edge of the display region.

7. The display substrate according to claim 6, wherein the test signal wires comprises at least one test control signal wire and a plurality of test data signal wires; each first test unit comprises a plurality of test transistors, the plurality of test transistors being disposed along the first direction; control electrodes of the plurality of test transistors are connected to a same test control signal wire, first electrodes of the plurality of test transistors are respectively connected to different test data signal wires, and second electrodes of the plurality of test transistors are respectively connected to different data signal wires in a display region.

8. The display substrate according to claim 7, wherein the plurality of test transistors being disposed along the first direction comprises that the test transistors are sequentially disposed along the first direction and are flush in the second direction.

9. The display substrate according to claim 7, wherein at least one compensation capacitor is provided between the power signal wire and the display region, and the compensation capacitor comprises a first polar plate and a second polar plate, wherein the first polar plate is connected to a second power line, one terminal of the second polar plate is connected to the test data signal wire of the first test unit, and the other terminal of the second polar plate is connected to the data signal wires of the display region.

10. The display substrate according to claim 4, wherein the first test unit has a height of 0.9 times to 1.3 times a width of the first test unit; wherein the height of the first test unit is a dimension of the first test unit in the first direction, and the width of the first test unit is a dimension of the first test unit in the second direction.

11. The display substrate according to claim 2, wherein at least one of the third corner and the fourth corner is provided with a plurality of multiplexing units, which are respectively disposed in the plurality of second rectangle regions.

12. The display substrate according to claim 11, wherein at least one multiplexing unit is disposed in a same second rectangle region in at least one of the third corner and the fourth corner;
or
wherein at least one shift register unit is disposed in a same first rectangle region in at least one of the third corner and the fourth corner.

13. The display substrate according to claim 11, wherein the stepped first wiring comprises a gate signal wire stepped wired, the plurality of stepped second wirings comprise a multiplexing signal wire stepped wired, and the stepped third wiring comprises a power signal wire stepped wired; a minimum distance between the power signal wire and an edge of the display region is smaller than that between the multiplexing signal wire and the edge of the display region, and a minimum distance between the multiplexing signal wire and the edge of the display region is smaller than that between the gate signal wire and the edge of the display region.

14. The display substrate according to claim 13, wherein the multiplexing signal wire comprises a plurality of multiplexing control signal wires and at least one multiplexing data signal wire; each multiplexing unit comprises a plurality of multiplexing transistors which are disposed along the first direction; control electrodes of the plurality of multiplexing transistors are connected to different multiplexing control signal wires, first electrodes of the plurality of multiplexing transistors are connected to a same multiplexing data signal wire, and second electrodes of the plurality of multiplexing transistors are respectively connected to different data signal wires in a display region.

15. The display substrate according to claim 14, wherein the plurality of multiplexing transistors being disposed along the first direction comprises that the multiplexing transistors are sequentially disposed along the first direction and are flush in the second direction.

16. The display substrate according to claim 11, wherein the multiplexing units have a height of 0.5 times to 0.9 times of a width of the multiplexing units; wherein the height of the multiplexing units is a dimension of the multiplexing units in the first direction, and the width of the multiplexing units is a dimension of the multiplexing units in the second direction.

17. A display apparatus, comprising the display substrate of claim 1.

18. A manufacturing method for a display substrate, wherein the display substrate comprises:
a display region and a bezel region located on a periphery of the display region; the bezel region comprises a first bezel and a second bezel oppositely disposed in a first direction, a third bezel and a fourth bezel oppositely disposed in a second direction, a first corner connecting the first bezel and the third bezel, a second corner connecting the second bezel and the third bezel, a third corner connecting the first bezel and the fourth bezel, and a fourth corner connecting the second bezel and the fourth bezel; at least one of the first corner to the fourth corner is an arced corner; the first direction is an extending direction of scanning signal wires in the display region, and the second direction is an extending direction of data signal wires in the display region,
the manufacturing method comprising:
forming a display structure in the display region;
forming a stepped first wiring, a plurality of stepped second wirings and a plurality of shift register units in at least one of the first corner to the fourth corner, wherein the stepped first wiring comprises a first wiring segment extending along the first direction and a first wiring segment extending along the second direction, the plurality of stepped second wirings comprise a second wiring segment extending along the first direction and a second wiring segment extending along the second direction;

forming a plurality of first rectangle regions by the first wiring segment extending along the first direction, the first wiring segment extending along the second direction, the second wiring segment extending along the first direction and the second wiring segment extending along the second direction which are adjacent; and disposing a plurality of shift register units respectively in the plurality of first rectangle regions, wherein the plurality of stepped second wirings are a plurality of stepped test signal wires, at least one third rectangle region is formed between one of the plurality of stepped test signal wires and the rest of the plurality of stepped test signal wires, and a dummy unit is disposed in the at least one third rectangle region.

19. The manufacturing method according to claim 18, wherein at least one of the first corner to the fourth corner is further provided with a stepped third wiring, which is disposed between the display region and the plurality of stepped second wirings, wherein the stepped third wiring comprises a third wiring segment extending along the first direction and a third wiring segment extending along the second direction, and a plurality of second rectangle regions are formed by the second wiring segment extending along the first direction, the second wiring segment extending along the second direction, the third wiring segment extending along the first direction and the third wiring segment extending along the second direction which are adjacent.

* * * * *